US011329061B2

(12) United States Patent
Xiao et al.

(10) Patent No.: US 11,329,061 B2
(45) Date of Patent: May 10, 2022

(54) METHOD FOR IMPROVING CHANNEL HOLE UNIFORMITY OF A THREE-DIMENSIONAL MEMORY DEVICE

(71) Applicant: Yangtze Memory Technologies Co., Ltd., Hubei (CN)

(72) Inventors: Li Hong Xiao, Hubei (CN); Qian Tao, Hubei (CN); Yushi Hu, Hubei (CN); Xiao Tian Cheng, Hubei (CN); Jian Xu, Hubei (CN); Haohao Yang, Hubei (CN); Yue Qiang Pu, Hubei (CN); Jin Wen Dong, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 0 days.

(21) Appl. No.: 16/126,267

(22) Filed: Sep. 10, 2018

(65) Prior Publication Data
US 2019/0074290 A1 Mar. 7, 2019

Related U.S. Application Data

(63) Continuation of application No. PCT/CN2018/098327, filed on Aug. 2, 2018.

(30) Foreign Application Priority Data

Aug. 2, 2018 (CN) .......................... 201710775876.7

(51) Int. Cl.
*H01L 27/11582* (2017.01)
*H01L 27/11565* (2017.01)
(Continued)

(52) U.S. Cl.
CPC .... *H01L 27/11582* (2013.01); *H01L 21/0337* (2013.01); *H01L 21/3086* (2013.01);
(Continued)

(58) Field of Classification Search
CPC .......... H01L 27/11565; H01L 27/1157; H01L 27/11582; H01L 21/0337; H01L 21/28282;
(Continued)

(56) References Cited

U.S. PATENT DOCUMENTS 8,828,884 B2    9/2014 Lee et al.
8,952,426 B2 *  2/2015 Maejima ........... H01L 27/11565
                                                257/214
(Continued)

FOREIGN PATENT DOCUMENTS

CN    102651312 A    8/2012
CN    103456358 A    12/2013
(Continued)

OTHER PUBLICATIONS

International Search Report and Written Opinion of the International Searching Authority directed to related International Patent Application No. PCT/CN2018/098327, dated Nov. 6, 2018; 8 pages.

*Primary Examiner* — Evren Seven
(74) *Attorney, Agent, or Firm* — Sterne, Kessler, Goldstein & Fox P.L.L.C.

(57) ABSTRACT

A method for forming a three-dimensional memory device includes disposing a material layer over a substrate, forming a plurality of channel-forming holes and a plurality of sacrificial holes around the plurality of channel-forming holes in an array-forming region of the material layer, and forming a plurality of semiconductor channels based on the channel-forming holes and at least one gate line slit (GLS) based on at least one of the plurality of sacrificial holes. A location of the at least one GLS overlaps with the at least one of the plurality of sacrificial holes.

20 Claims, 19 Drawing Sheets

(51) Int. Cl.
*H01L 27/1157* (2017.01)
*H01L 21/762* (2006.01)
*H01L 21/033* (2006.01)
*H01L 29/423* (2006.01)
*H01L 21/308* (2006.01)
*H01L 21/28* (2006.01)
*H01L 21/311* (2006.01)

(52) U.S. Cl.
CPC .. *H01L 21/31144* (2013.01); *H01L 21/76229* (2013.01); *H01L 27/1157* (2013.01); *H01L 27/11565* (2013.01); *H01L 29/40117* (2019.08); *H01L 29/42344* (2013.01)

(58) Field of Classification Search
CPC ........... H01L 21/3086; H01L 21/76229; H01L 29/42344; H01L 21/31144; H01L 29/40117
See application file for complete search history.

(56) References Cited

U.S. PATENT DOCUMENTS

| | | | |
|---|---|---|---|
| 9,368,646 B2 | 6/2016 | Kim et al. | |
| 9,576,973 B2 | 2/2017 | Lee et al. | |
| 9,679,907 B1 | 6/2017 | Kaneko | |
| 10,090,310 B2 * | 10/2018 | Goda | H01L 27/11556 |
| 10,128,264 B2 | 11/2018 | Lee | |
| 10,163,924 B2 | 12/2018 | Ahn | |
| 10,229,927 B2 * | 3/2019 | Lee | H01L 27/11582 |
| 2008/0254576 A1 | 10/2008 | Hsia et al. | |
| 2012/0061743 A1 | 3/2012 | Watanabe et al. | |
| 2015/0008503 A1 | 1/2015 | Makala et al. | |
| 2017/0236836 A1 | 8/2017 | Huo et al. | |
| 2018/0277556 A1 * | 9/2018 | Kang | H01L 27/11519 |

FOREIGN PATENT DOCUMENTS

| | | |
|---|---|---|
| CN | 104157654 A | 11/2014 |
| CN | 104396004 A | 3/2015 |
| CN | 105280590 A | 1/2016 |
| CN | 106129010 A | 11/2016 |
| CN | 106856198 A | 6/2017 |
| CN | 106992180 A | 7/2017 |
| CN | 110088902 B | 5/2020 |
| TW | I544609 B | 8/2016 |
| WO | WO 2017074552 A1 | 5/2017 |
| WO | WO 2019/042071 A1 | 3/2019 |

* cited by examiner

METHOD FOR IMPROVING CHANNEL HOLE UNIFORMITY OF A THREE-DIMENSIONAL MEMORY DEVICE

CROSS-REFERENCES TO RELATED APPLICATIONS

This application claims priority to PCT/CN2018/098327 filed Aug. 2, 2018, which claims priority to Chinese Patent Application No. 201710775876.7 filed on Aug. 31, 2017, the entire contents of which are incorporated herein by reference.

BACKGROUND

Flash memory devices have undergone rapid development. Flash memory devices can store data for a considerably long time without powering, and have advantages such as high integration level, fast access, easy erasing, and rewriting. As advances in integration level and increases in demand for storage, to further improve the bit density and reduce cost of flash memory devices, three-dimensional (3D) NAND flash memory devices have been developed. 3D memory devices can greatly save the number of wafers used for device making.

A three-dimensional 3D memory device includes multiple tiers of word lines (or gate electrodes) arranged over a substrate, with a plurality of semiconductor channels, through and intersecting word lines, into the substrate. A different level/tier represents a different height from the surface of the substrate. The semiconductor channels are arranged in an array through the word lines.

To form semiconductor channels, channel holes are formed before being filled with channel-forming materials (e.g., a charge trapping film, a semiconductor channel film, and a dielectric core). The channel holes can be formed by a patterning/etching process. However, the formation of the channel holes can be susceptible to the arrangement of the channel holes, causing undesirable deviations in the channel hole dimensions. Device performance can be impaired.

BRIEF SUMMARY

Embodiments of three-dimensional memory device architectures and fabrication methods therefore are disclosed herein. The disclosed structures and methods provide numerous benefits, including, but not limited to simplifying the fabrication process, reducing the size of the three-dimensional memory device, and improving the space utility of the chip which the three-dimensional memory device is formed on.

In some embodiments, a method for forming a three-dimensional memory device includes disposing a material layer over a substrate. A plurality of channel-forming holes are formed in the material layer. In an array-forming region of the material layer a plurality of sacrificial holes are formed around the plurality of channel-forming holes. A plurality of semiconductor channels are formed based on the channel-forming holes. At least one gate line slit (GLS) is formed based on at least one of the plurality of sacrificial holes. A location of the at least one GLS can overlap with the at least one of the plurality of sacrificial holes.

In some embodiments, forming the plurality of channel-forming holes and the plurality of sacrificial holes includes forming a first patterned photoresist layer over the material layer. The first patterned photoresist layer can include a plurality of channel-forming openings and a plurality of sacrificial openings. In some embodiments, forming the plurality of channel-forming holes and the plurality of sacrificial holes also include forming the plurality of channel-forming openings and the plurality of sacrificial openings through the material layer until the substrate is exposed.

In some embodiments, the method further includes locating the plurality of sacrificial holes adjacent to boundaries of the array-forming region.

In some embodiments, the method further includes forming the plurality of channel-forming holes and the plurality of sacrificial holes to have same cross-sectional dimensions.

In some embodiments, the method further includes arranging the plurality of channel-forming holes and the plurality of sacrificial holes in an array and locating the plurality of channel-forming holes adjacent to the plurality of sacrificial holes.

In some embodiments, the method further includes forming the plurality of channel-forming holes and the plurality of sacrificial holes in the array-forming region. In some embodiments, the method further includes locating the plurality of sacrificial holes in at least one column that is distributed adjacent to the boundaries of the array-forming region.

In some embodiments, the method further includes distributing the plurality of sacrificial holes in two columns on two sides of the array and arranging each column of the plurality of sacrificial holes to be adjacent to a boundary of the array.

In some embodiments, the method further includes forming two adjacent top select gates (TSGs) separated by a TSG-oxide-fill in the array-forming region and locating each of the two columns of the plurality of sacrificial holes on a different side of the TSGs.

In some embodiments, the method further includes forming the plurality of sacrificial holes of same dimensions as of the plurality of channel-forming holes.

In some embodiments, the processes of forming the plurality of semiconductor channels based on the channel-forming holes and forming the at least one GLS based on the at least one of the plurality of sacrificial holes include filling the plurality of channel-forming holes and forming a plurality of dielectric filling structures. The plurality of channel-forming holes can be formed with channel-forming layers. The plurality of channel-forming holes can be formed based on the plurality of sacrificial holes. In some embodiments, the processes also include forming at least one GLS-forming trench to remove the plurality of dielectric filling structures. The process can further include filling the at least one GLS-forming trench with a conductive material.

In some embodiments, the process of forming the plurality of dielectric filling structures (e.g., based on the plurality of sacrificial holes) includes filling the plurality of sacrificial holes with the channel-forming layers. The process can also include removing the channel-forming layers in the plurality of sacrificial holes to form a plurality of dielectric filling holes. The process can further include forming a dielectric filling material in the plurality of dielectric filling holes.

In some embodiments, forming the sacrificial dielectric material includes performing a low-temperature spin-on dielectric process.

In some embodiments, the method further includes forming the at least one GLS-forming trench with a projection (e.g., on the substrate) that covers a projection of at least one of the plurality of dielectric filling structures (e.g., on the substrate).

In some embodiments, the method further includes forming two GLS-forming trenches. Each of the at least one GLS-forming trench can be located adjacent to a different side of the boundaries of the array-forming region.

In some embodiments, the method further includes forming the at least one GLS-forming trench with a projection (e.g., on the substrate) that is greater than the projection of the plurality of dielectric filling structures (e.g., on the substrate).

In some embodiments, the method further includes forming the dielectric filling material with at least one material that forms the material layer.

In some embodiments, forming the dielectric filling material includes forming silicon oxide.

In some embodiments, the method further includes forming the plurality of dielectric filling holes of dimensions same as the plurality of sacrificial holes.

In some embodiments, the method further includes cleaning the plurality of channel-forming holes. The plurality of channel-forming holes can be cleaned before the plurality of channel-forming holes is filled with the channel-forming layers.

In some embodiments, the material layer includes at least one of a staircase structure and a dielectric stack.

In some embodiments, the conductive material includes tungsten.

In some embodiments, the method further includes planarizing the at least one GLS-forming trench after the conductive material is filled in the at least one GLS-forming trench.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

Figure 1:
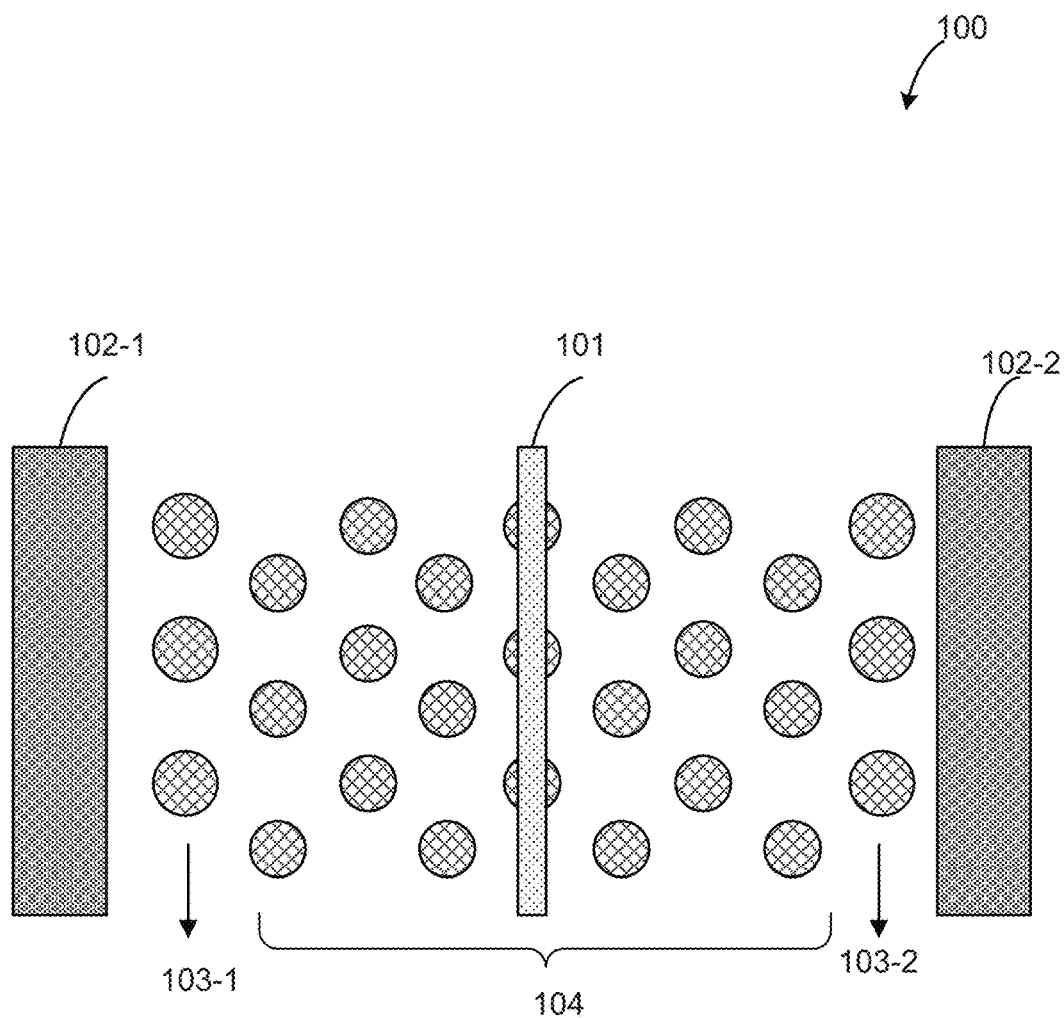
FIG. 1 illustrates a 9-hole array channel hole arrangement.

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND strings) on a laterally-oriented substrate so that the memory strings extend in the vertical direction with respect to the substrate. As used herein, the term "vertical/vertically" means nominally perpendicular to the lateral surface of a substrate.

In the present disclosure, for ease of description, "tier" is used to refer to elements of substantially the same height along the vertical direction. For example, a word line and the underlying gate dielectric layer can be referred to as "a tier," a sacrificial layer and the underlying insulating layer can together be referred to as "a tier," a word line and the underlying insulating layer can together be referred to as "a tier," word lines of substantially the same height can be referred to as "a tier of word lines" or similar, and so on.

Figure 19:
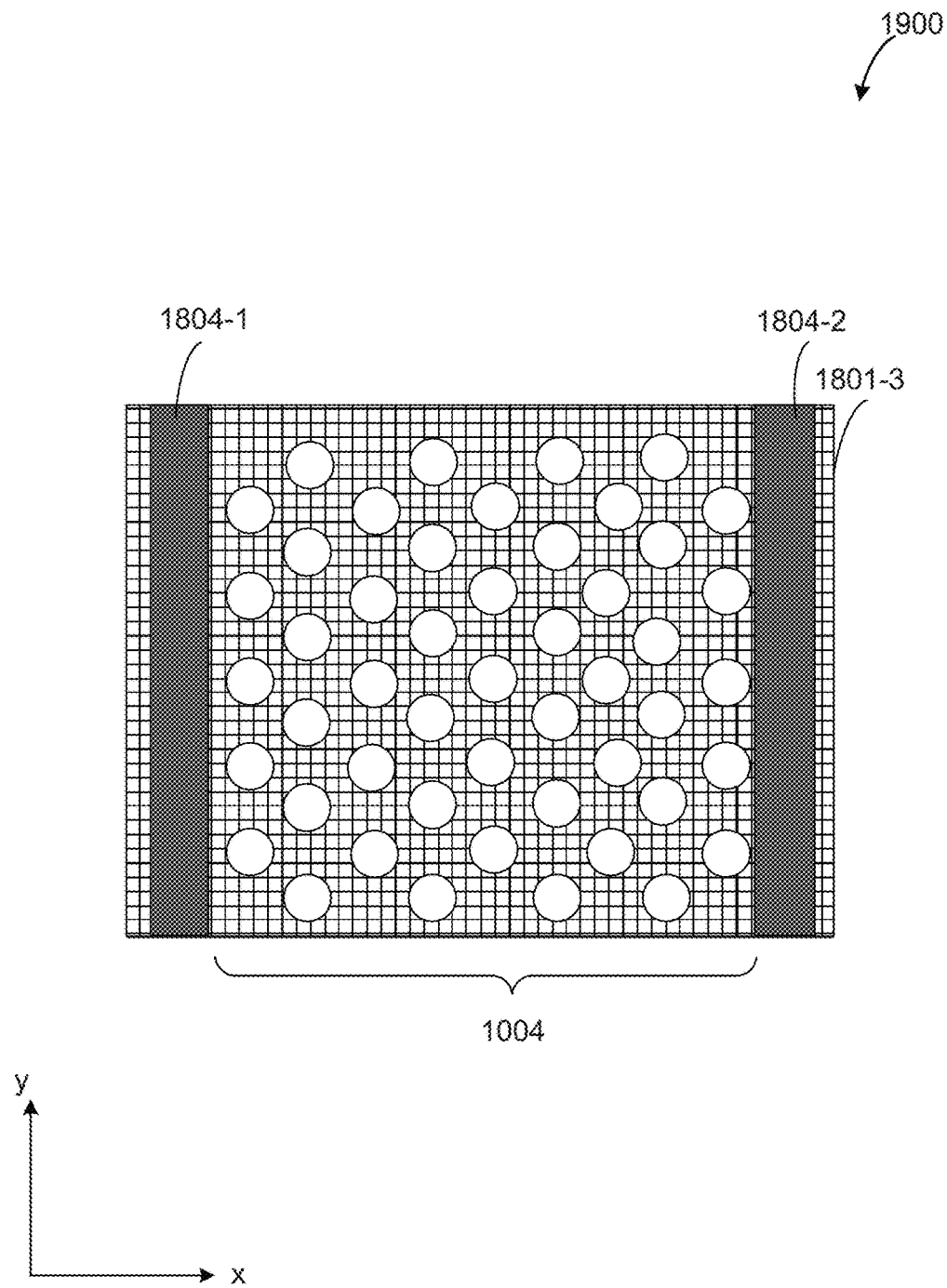
FIG. 19 illustrates a top view of FIG. 18.

A 64-tier 3D memory device often has 9 columns of channel holes between two gate line slits (GLSs). These 9 columns correspond to one top select gate (e.g., TSG, the select gate is positioned along the middle line of and over the 9 columns of channel holes). This arrangement is often referred to as a "9-hole array channel hole" arrangement. An example of a top view of this arrangement is shown in FIG. 19 columns of channel holes, arranged in the 9-hole array channel hole arrangement, are located between GLSs 102-1 and 102-2. The channel holes of two outermost columns 103-1 and 103-2 (e.g., the columns that are farthest away from the top select gate in the middle and are closest to gate line slits) are referred to as "outer channel holes," and the other channel holes 104 are referred to as "inner channel holes." Outer channel holes 103 and inner channel holes 104 correspond to a TSG 101.

The arrangement of outer channel holes has a different pattern density (e.g., the outer channel holes are positioned between the inner channel holes and gate line slits, and the inner holes are surrounded by outer and inner channel holes) than that of the inner channel holes, during the patterning/etching of channel holes. Accordingly, the etching conditions for the outer channel holes and inner channel holes can be altered by the difference in pattern density. For example, a plasma for etching) distributed over the outer channel holes and the inner channel hole can be different. This can cause dimensional non-uniformity (e.g., the channel holes having non-uniform dimensions) in the channel hole. For example, the outer channel holes can be about 5%-10% smaller than the inner channel holes.

To suppress or avoid the non-uniformity issue, a photomask pattern for patterning the outer channel holes are often bigger (e.g., 5%-10%) than a photomask pattern for patterning the inner channel holes. However, this approach has not completely solve the problem, and the channel holes still suffer from non-uniformity issues caused by the difference in pattern density. The inner channel holes and outer channel holes of the 9-hole array channel hole arrangement still have non-uniform dimensions. Thus, the fabrication of channel holes of the 9-hole array channel hole arrangement needs to be improved.

In the present disclosure, a "staircase structure" or a "stepped cavity structure," or similar refer to a structure having stepped surfaces. In the present disclosure, "stepped surfaces" refer to a set of surfaces that include at least two horizontal surfaces (e.g., being parallel to the top surface of the substrate) and at least two vertical surfaces (e.g., along the z axis) such that each horizontal surface is adjoined to a first vertical surface that extends upward from a first edge of the horizontal surface, and is adjoined to a second vertical surface that extends downward from a second edge of the horizontal surface. A "step" or "staircase" refers to a vertical shift in the height of a set of adjoined surfaces. In the figures of the present disclosure, y axis propagates along a direction perpendicular to the x-z plane.

In the present disclosure, a dielectric stack or a stack of dielectric pairs refers to a pile of (or a plurality of) dielectric pairs stacked along the direction perpendicular to the top surface of the substrate. The dielectric stack can undergo a repetitive patterning and/or etching process to form a staircase structure. Channel holes can be formed in the staircase structure or in the dielectric stack (e.g., before the formation of the staircase structure) and can extend from the top surface into the substrate. The formation of staircase can be formed at any suitable stage of the fabrication process before the formation of word lines. The specific order to form the channel holes and the staircase structure (e.g., from the dielectric stack) should not be limited by the embodiments of the present disclosure.

Figure 2:
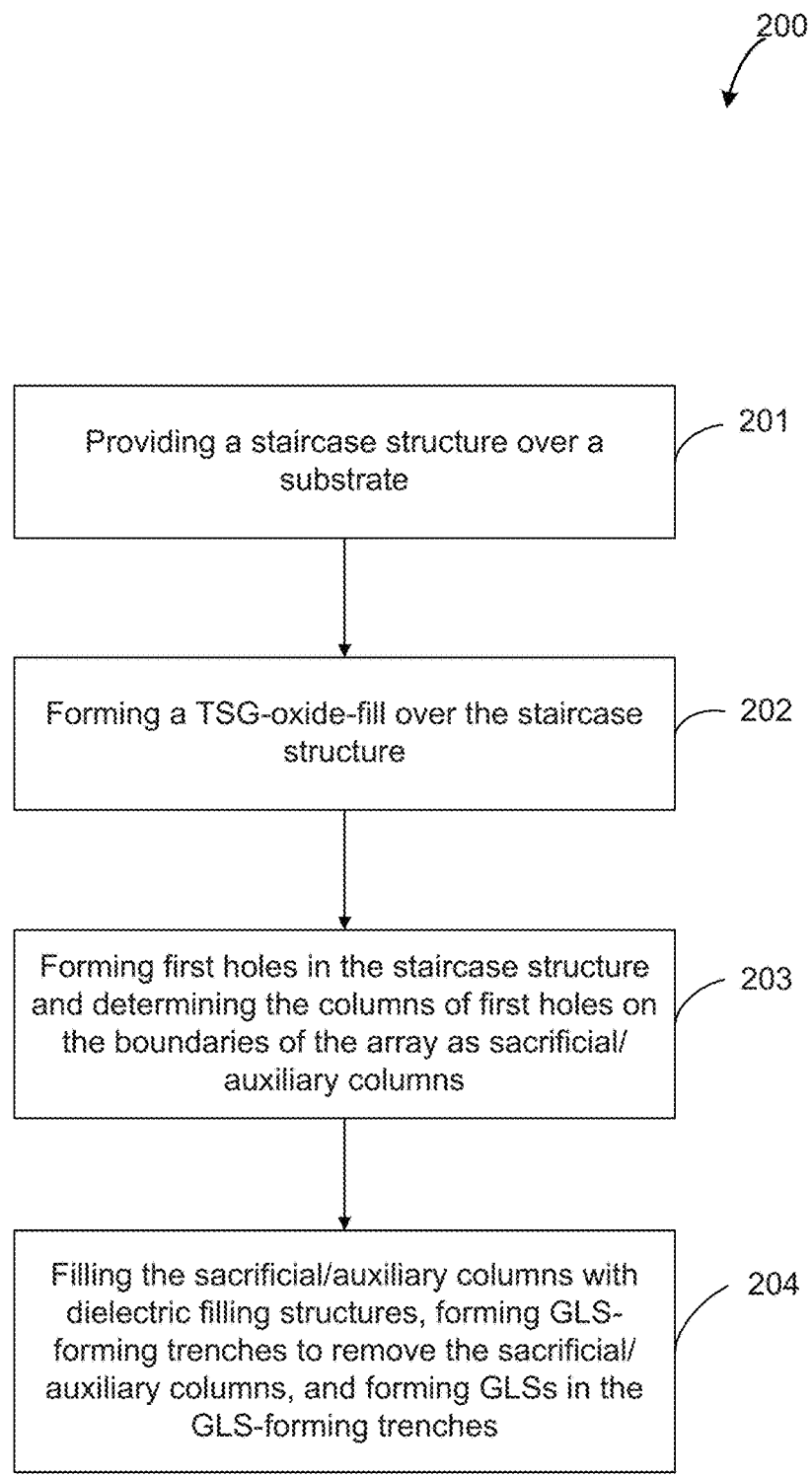
FIG. 2 illustrates an exemplary process for forming a 3D memory device, according to some embodiments.

FIG. 2 illustrates an exemplary fabrication process for forming channel holes in a 3D memory device, according to some embodiments. FIGS. 3-8, 10-14, 16, 18 each illustrates a cross-section view of the 3D memory device at a different stage of the fabrication process, according to some embodiments. FIGS. 9, 15, 17, and 19 are respectively top views of FIGS. 8, 14, 16, and 18. The fabrication process of the 3D memory device of FIG. 2 is described in view of FIGS. 3-19.

Figure 3:
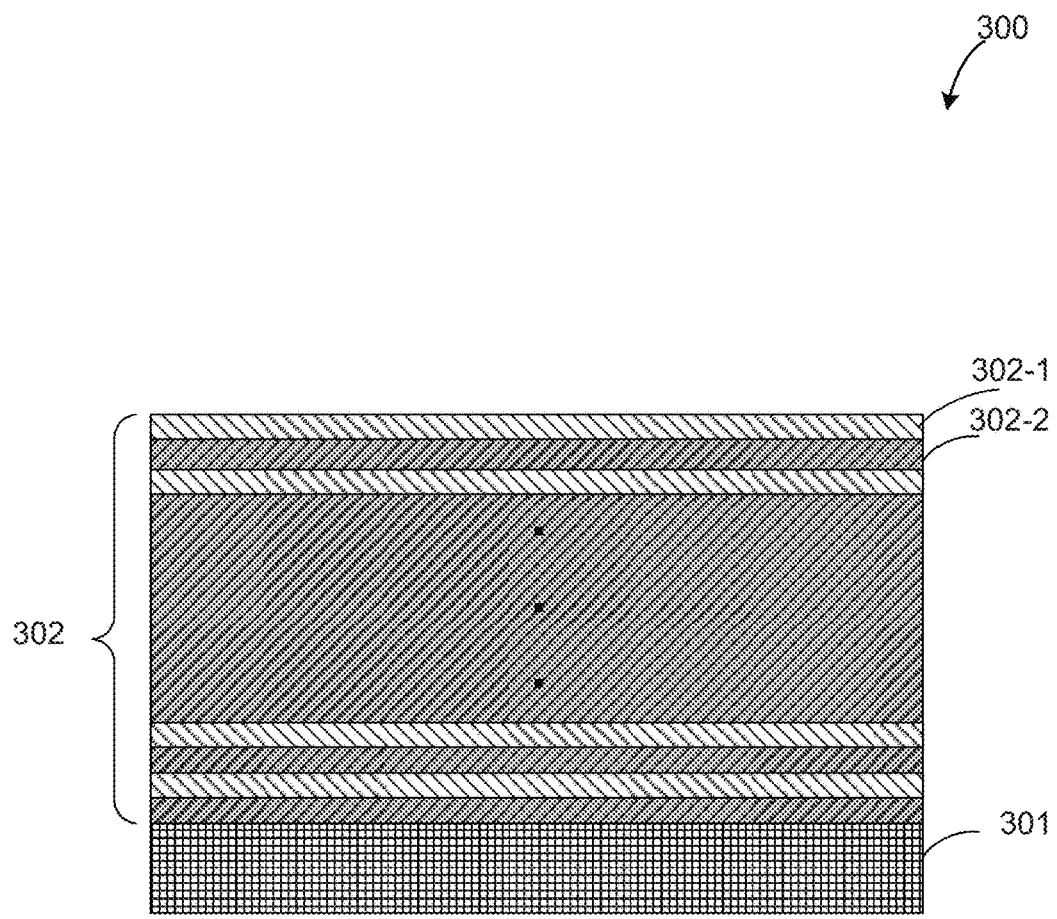
FIGS. 3-8, 10-14, 16, 18 illustrate cross-sectional views of a 3D memory device at a different stages of a fabrication process, according to some embodiments.

As shown in FIG. 2, at the beginning of the fabrication process, a staircase structure (e.g., material layer) can be provided or deposited (Step 201). FIG. 3 illustrates a corresponding cross-sectional view of a portion of the staircase structure, according to some embodiments.

As shown in FIG. 3, memory structure 300 can include a staircase structure 302 formed over a substrate 301. Channel holes for forming semiconductor channels can be formed subsequently in staircase structure 302. Substrate 301 can include any suitable material for subsequent fabrication processes to form the 3D memory device. For example, substrate 301 can include silicon, silicon germanium, silicon carbide, silicon on insulator (SOI), germanium on insulator (GOI), glass, gallium nitride, gallium arsenide, and/or other suitable III-V compound. In some embodiments, substrate 301 includes silicon.

Staircase structure 302 can include a plurality of insulating layers and sacrificial layers alternatingly arranged along a direction perpendicular to the top surface of substrate 301 (e.g., the z direction). An insulating layer can be sandwiched by two adjacent sacrificial layers, and vice versa. Elements 302-1 and 302-2 can each represent a different one of an insulating layer and a sacrificial layer. For illustrative purposes, 302-1 can represent an insulating layer and 302-2 can represent a sacrificial layer. Sacrificial layer 302-2 and insulating layer 302-1 can have same or different thicknesses. For example, staircase structure 302 can include a 64 alternatingly arranged insulating layers and sacrificial layers, and can provide a base for forming a 64-tier 3D memory device. Sacrificial layer 302-2 can include any suitable material different from insulating layer 302-1. For example, in some embodiments, sacrificial layers 302-2 can include poly-crystalline silicon, silicon nitride, poly-crystalline germanium, and/or poly-crystalline germanium-silicon. In some embodiments, sacrificial layers 302-2 include silicon nitride. Insulating material layers 302-1 can include any suitable insulating materials, e.g., silicon oxide.

In some embodiments, element 302 includes a dielectric stack, and the staircase structure (e.g., formed based on the dielectric stack) is formed at a suitable stage of the fabrication process before the formation of word lines. In some embodiments, a staircase structure is formed after the formation of channel holes. Dielectric stack 302 can include a plurality of dielectric pairs stacked along a direction perpendicular to a top surface of substrate 301 (e.g., the z direction). Each dielectric pair can include an insulating material layer and a sacrificial material layer. For example, dielectric stack 302 can include 64 tiers of dielectric pairs and can provide a base for forming a 64-tier 3D memory device. An insulating material layer can be sandwiched by two adjacent sacrificial material layers, and vice versa. Elements 302-1 and 302-2 can each represent a different one of an insulating material layer and a sacrificial material layer. For illustrative purposes, 302-1 can represent an insulating material layer and 302-2 can represent a sacrificial material layer. Sacrificial material layer 302-2 and insulating material layer 302-1 can have same or different thicknesses. Sacrificial material layer 302-2 can include any suitable material different from insulating material layer 302-1.

After the channel holes are formed, dielectric stack 302 can undergo repetitive etching/patterning to form a staircase structure. An etch mask (e.g., a photoresist layer) can be trimmed/etched to expose the portions of insulating material layers 302-1 and sacrificial material layers 302-2 to be etched. Any suitable etchants (e.g., dry etchants and/or wet etchants) can be used to etch away exposed portions. Insulating material layers 302-1 can be etched to form insulating layers of the staircase structure, and sacrificial material layers 302-2 can be etched to form sacrificial layers of the sacrificial layers of the staircase structure. In various embodiments, the specific order to form the channel holes and the staircase structure should not be limited by the embodiments of the present disclosure.

Dielectric stack 302 can be formed by alternatingly depositing insulating material layers and sacrificial material layers to form a dielectric material stack over substrate 301. The deposition of sacrificial material layers and insulating material layers can include any suitable deposition methods such chemical vapor deposition (CVD), physical vapor deposition (PAID), plasma-enhanced CVD (PECVD), sputtering, metal-organic chemical vapor deposition (MOCVD), and/or atomic layer deposition (ALD). Further, a planarization process can be performed to planarize the dielectric material stack into a suitable thickness. Dielectric stack 302 can thus be formed. In some embodiments, insulating material layer 302-1 is exposed by the planarization process. In some embodiments, the planarization process includes a chemical mechanical planarization (CMP) process and/or a recess etch process. Optionally, a gate dielectric layer (not shown in the figures) is formed between dielectric stack 302 and substrate 301 by any suitable deposition process such as PECVD. The gate dielectric layer can include, e.g., silicon oxide.

In various embodiments, element 302 can include at least a staircase structure and a dielectric stack, e.g., in a fabrication process to form a multiple-stack staircase structure (or multiple-stack three-dimensional memory device). The multiple-stack staircase structure can be formed based on multiple dielectric stacked arranged along a direction perpendicular to substrate 301. The specific type of material layer should not be limited by the embodiments of the present disclosure.

Figure 4:
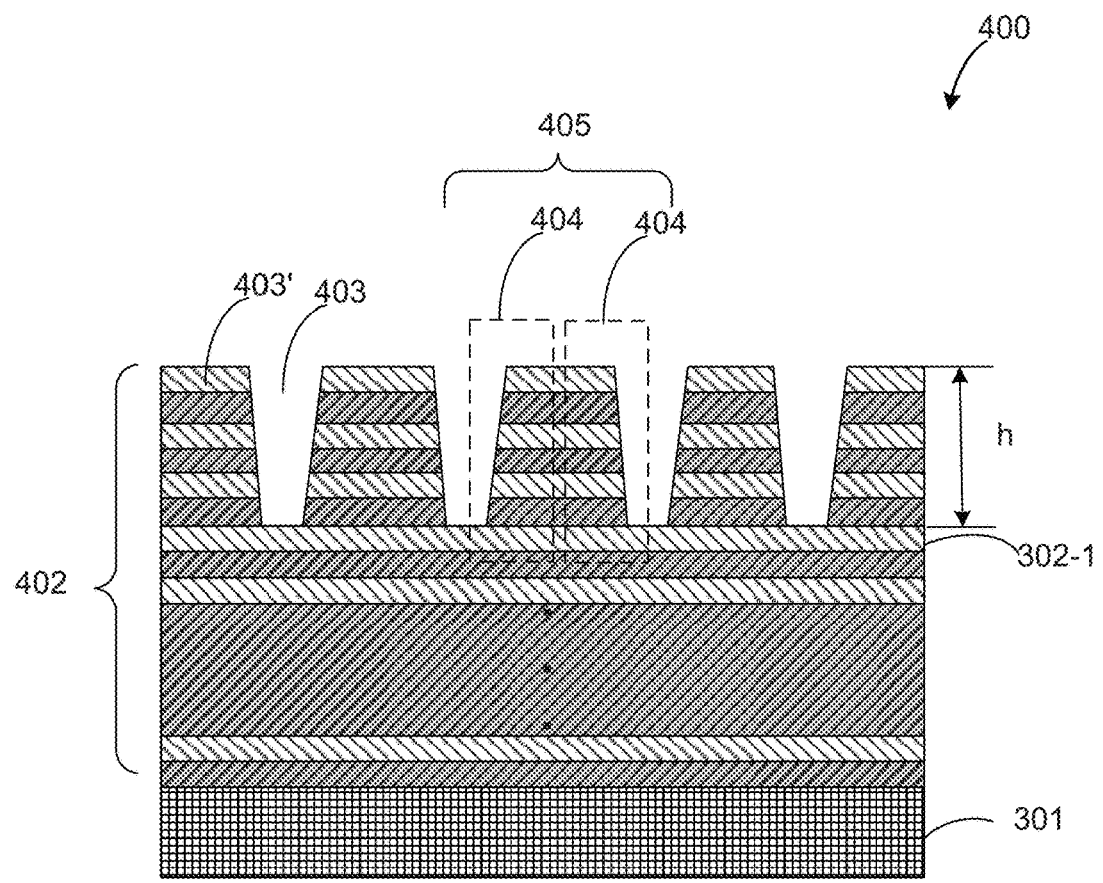
Figure 5:
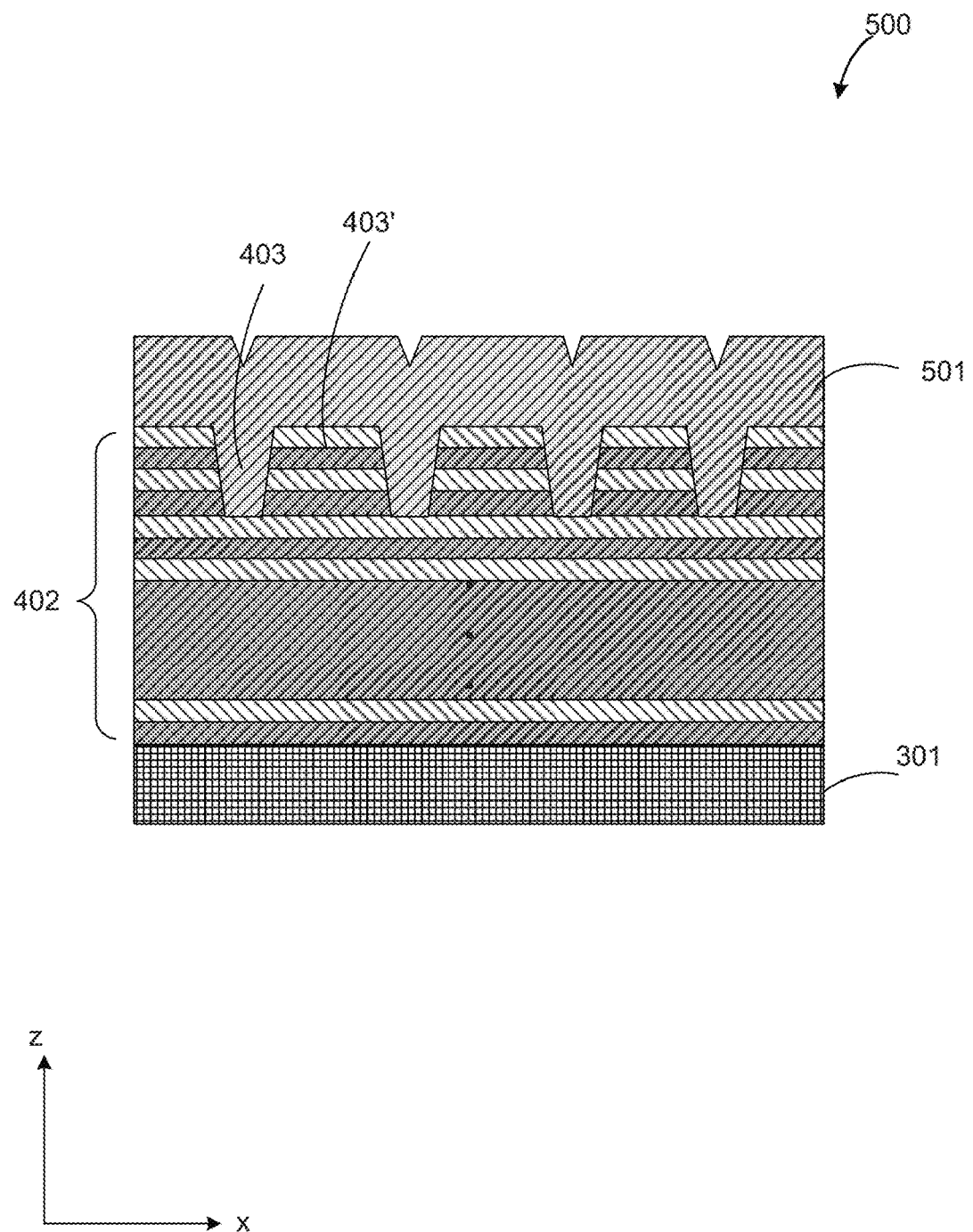

Referring back to FIG. 2, after the staircase structure is provided, a TSG can be formed over the staircase structure (Step 202). FIGS. 4-5 illustrate corresponding cross-sectional views of the memory structures, according to some embodiments.

After the staircase structure is provided, a plurality of trenches can be formed over the staircase structure, according to some embodiments. FIG. 4 illustrates a corresponding memory structure 400. As shown in FIG. 4, a plurality of trenches 403 (also be referred to as TSG-Cuts) can be formed over a staircase structure 402. Trenches 403 can extend along the y axis (e.g., perpendicular to the x-z plane). Portions 403' of staircase structure 402 separated by trenches 403 can also extend along the y axis for forming TSGs. In some embodiments, each portion 403' forms two TSGs of at least substantially the same surface areas. For simplicity, each portion corresponds to two TSG-forming regions 404. Each trench 403 and the two adjacent TSG-forming regions 404 can together be referred to as an array-forming region 405, as shown in FIG. 4. Staircase structure 402 represents staircase structure 302 with the plurality of trenches 403. Trench 403 can have a depth h of about 3-4 tiers along the z axis. In some embodiments, the bottom of trench 403 stops on the top surface of an insulating layer 302-1. Trench 403 can have any suitable cross-sectional shape along the x-z plane. For example, trench 403 can have a pillar cross-sectional shape or a trapezoid cross-sectional shape. In some embodiments, due to the effect of aspect ratio, trench 403 has a trapezoid shape, as shown in FIG. 4. Staircase structure 402 represents staircase structure 302 after the formation of trenches 403.

Trenches 403 can be formed by any suitable patterning/etching processes. For example, a photoresist layer can be formed over staircase structure 302 and can be patterned by a photolithography process. A patterned photoresist layer can be formed. The patterned photoresist layer can include a plurality of openings exposing a top surface of staircase structure 302. The shapes and locations of the openings can correspond to the locations of the subsequently-formed trenches. Further, a suitable etching process (e.g., wet etch and/or dry etch) can be performed using the patterned photoresist layer as the etch mask to remove the portions of staircase structure 302 exposed by the openings. In some embodiments, the etch process can be timed so that depth h of trench 403 can be controlled to have the desired value/range. In some embodiments, the etchant contains carbon tetrafluoride ($CF_4$).

Further, a first oxide layer can be formed to cover the trenches, according to some embodiments. FIG. 5 illustrates a corresponding memory structure 500. As shown in FIG. 5, a first oxide layer 501 can be formed over and filling up trenches 403. A portion of first oxide layer in trench 403 can be referred to as a TSG-oxide-fill. In some embodiments, the TSG-oxide-fill insulates adjacent TSGs that are formed in subsequent operations. The top surface of first oxide layer 501 can be higher than the top surface of staircase structure 402. First oxide layer 501 can include any suitable insulating material and can be formed by any suitable deposition process. In some embodiments, first oxide layer 501 includes silicon oxide and can be deposited by PECVD. Optionally, a planarization process (e.g., CMP and/or recess etch) is performed to planarize the top surface of first oxide layer 501.

In some embodiments, a TSG can be formed in a TSG-forming region 404, and two TSGs can be formed in an array-forming region 405. In some embodiments, each TSG-oxide-fill insulates the two adjacent TSGs in each array-forming region 405. In subsequent fabrication operations, sacrificial layers in TSG-forming regions 404 and the rest of staircase structure 302 can be replaced by a conductive material (e.g., copper, aluminum, and/or tungsten) to form TSGs and word lines, respectively.

Referring back to FIG. 2, after the first oxide layer is formed, channel holes can be formed in the TSG-channel region of the staircase structure (Step 203). In some embodiments, the two columns of channel holes being farthest away from the TSG-oxide-fill (e.g., being adjacent to the subsequently-formed GLSs) are referred to as sacrificial auxiliary columns, and the channel holes of the two sacrificial/auxiliary columns are referred to as sacrificial/auxiliary holes. In some embodiments, the locations of the two sacrificial/auxiliary columns correspond to the locations of the subsequently-formed GLSs. FIGS. 6-8, 10-14, 16, and 18 illustrate corresponding memory structures 600-800, 1000-1400, 1600, and 1800, respectively.

Figure 6:
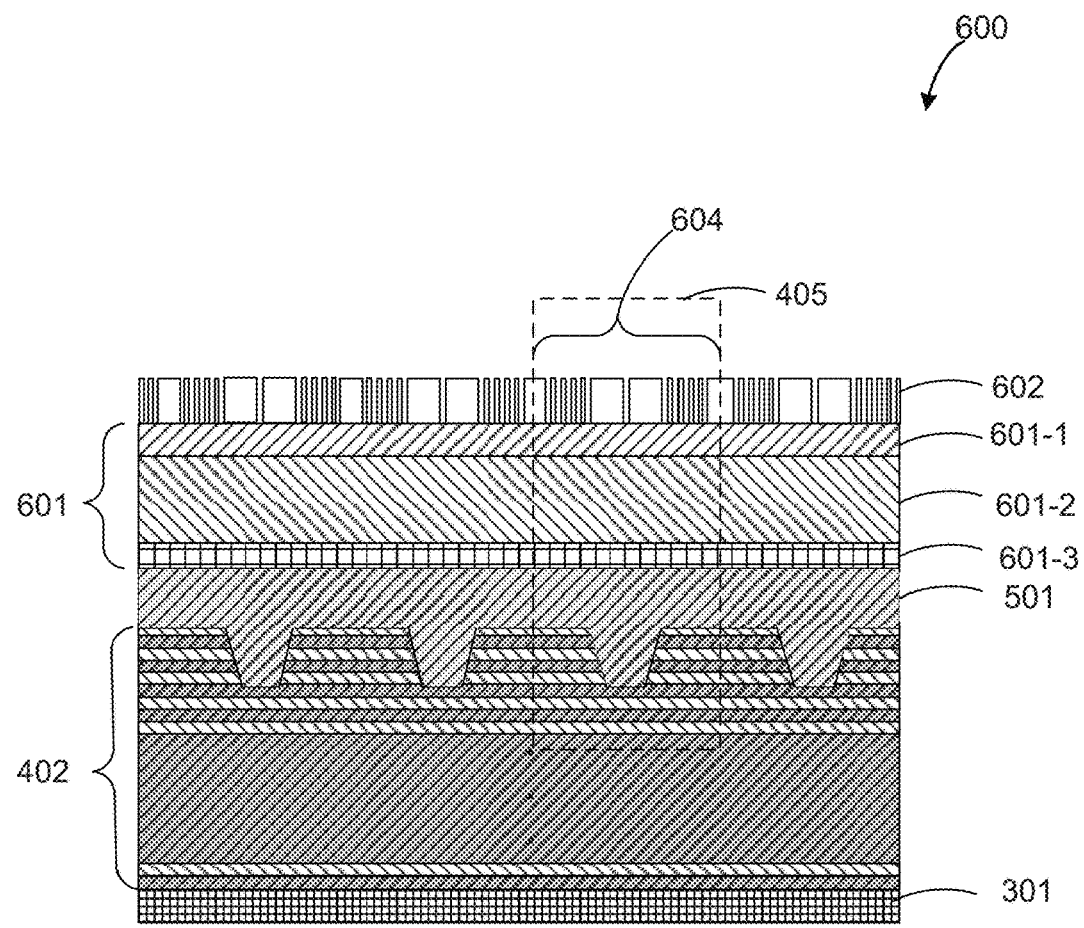

After the first oxide layer is formed, a hard mask layer can be formed over the first oxide layer, and a first patterned photoresist layer can be formed over the hard mask layer. FIG. 6 illustrates a corresponding memory structure 600. As shown in FIG. 6, a hard mask layer 601 can be formed over first oxide layer 501, and a first patterned photoresist layer 603 can be formed over hard mask layer 601. Hard mask layer 601 can include a third mask layer 601-3 over first oxide layer 501, a second mask layer 601-2 over third mask layer 601-3, and a first mask layer 601-1 over second mask layer 601-2. In some embodiments, first mask layer 601-1 includes a dielectric anti-reflective coating (e.g., silicon oxynitride), second mask layer 601-2 includes a patterning layer (e.g., amorphous carbon), and third mask layer 601-3 includes a hard mask layer silicon nitride). Optionally, a fourth mask layer (e.g., silicon dioxide) can be deposited between third mask layer 601-3 and first oxide layer 501. First patterned photoresist layer 603 can be formed by performing a photolithography process on a photoresist layer. The pattern of first patterned photoresist layer 603 can be referred to as a first pattern. The first pattern can determine the pattern/locations of the subsequently-formed channel holes.

First patterned photoresist layer 603 can include a plurality of openings 604 that exposes portions of the top surface of first mask layer 601-1. In some embodiments, the locations of openings 604 correspond to the locations of the subsequently-formed channel holes. That is, a perpendicular projection (e.g., along the z axis) of openings 604 on the top surface of staircase structure 402 can at least substantially overlap with the locations of the channel holes. In some embodiments, each array-forming region 405 includes 11 columns of openings 604 in first patterned photoresist layer 603 for forming channel holes. The 11 columns can extend at least substantially parallel to one another along the y axis (e.g., perpendicular to the x-z plane). In some embodiments, one of the 11 columns at least substantially overlaps with the middle line (e.g., along the x axis) of the underlying trench 403, and the rest 10 columns are distributed evenly on two sides of trench 403, with five columns on each side, as shown in FIG. 6.

Further, a suitable etching process (e.g., dry etch and/or wet etch) can be performed to remove the portions of hard mask layer 601 exposed by the first pattern. Patterned photoresist layer 603 can be used as an etch mask for the etching process. In some embodiments, portions of first mask layer 601-1 and second mask layer 601-2 (e.g., defined by openings 604) can be removed to form the patterned first mask layer and the patterned second mask layer, respectively. In some embodiments, the etch stops on third mask layer 601-3. The etching process can be timed by using one or more suitable etchants that etch first mask layer 601-1, second mask layer 601-2, and/or third mask layer 601-3. The etching process can also be performed by using one or more etchants that have sufficiently high etching selectivity on first mask layer 601-1 and second mask layer 601-2 over third mask layer 601-3 so that third mask layer 601-3 can be used as an etch-stop layer and the etching process can substantially stop on third mask layer 601-3. In some embodiments, etchants of the etching process are anisotropic and have high etching selectivity of first mask layer 601-1 and second mask layer 601-2 over third mask layer 601-3. In some embodiments, the etching process includes a reactive ion etching (RIE) process.

Figure 7:
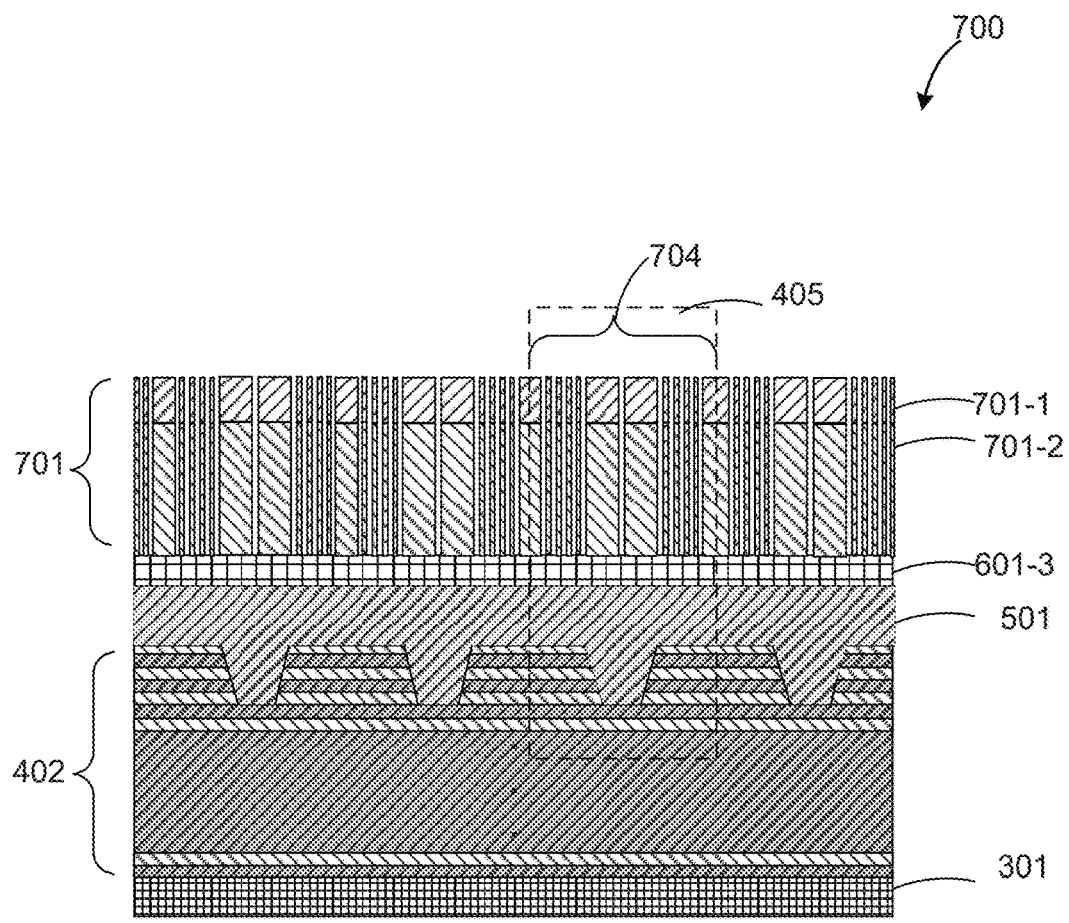

After the etching process, the first patterned photoresist layer can be removed by any suitable rinsing/cleaning process to expose the patterned first mask layer and the patterned second mask layer. FIG. 7 illustrates a corresponding memory structure 700. As shown in FIG. 7, first patterned photoresist layer 603 can be removed by any suitable rinsing/cleaning process to expose a patterned first mask layer 701-1 and a patterned second mask layer 701-2, as shown in FIG. 7. In some embodiments, first patterned photoresist layer 603 is removed by a wet etching process and/or a strip process. The patterns of patterned first mask layer 701-1 and patterned second mask layer 701-2 can be the same as or similar to the first pattern transferred by first patterned photoresist layer 603. Openings 704 formed by patterned first mask layer 701-1 and patterned second mask layer 701-2 can expose portions of third mask layer 601-3.

Further, patterned first mask layer 701-1 and patterned second mask layer 701-2 can be used as an etch mask to remove portions of third mask layer 601-3, first oxide layer 501, and staircase structure 402 defined by openings 704. Thus, the first pattern can be transferred to first oxide layer 501 and staircase structure 402 to form channel holes. In some embodiments, channel holes can extend from the top surface of staircase structure 402 into substrate 301. Any suitable dry etch and/or wet etch can be performed to remove the materials of third mask layer 601-3, first oxide layer 501, and staircase structure 402. In some embodiments, an anisotropic dry etching process (e.g., RIE) can be performed to etch these materials.

Further, the remaining patterned first mask layer 701-1 (e.g., after the formation of channel holes) can be removed. Optionally, a top portion of the remaining patterned second mask layer 701-2 can also be removed or over-etched for the removal of patterned first mask layer 701-1. In some embodiments, the remaining of patterned first mask layer 701-1 is over etched to ensure the complete removal of patterned first mask layer 701-1. Any suitable wet etching and/or dry etching process can be performed to remove patterned first mask layer 701-1 and/or the top portion patterned second mask layer 701-2. In some embodiments, a dry etch (e.g., RIE) is performed to remove remaining patterned first mask layer 701-1.

Figure 8:
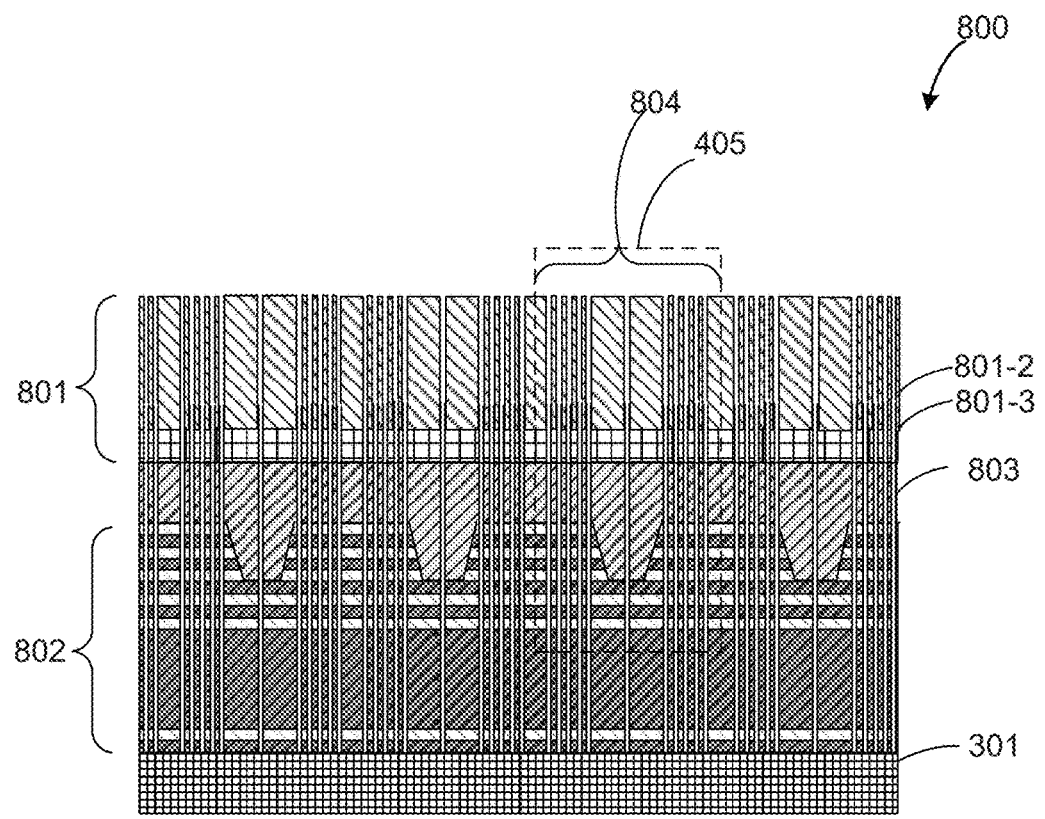

After the patterned first mask layer is removed, the remaining patterned second mask layer is used as an etch mask to form first holes. FIG. 8 illustrates a corresponding memory structure 800. As shown in FIG. 8, memory structure 800 includes a plurality of first holes 804 extending through the top surface of a hard mask layer 801 (or remaining patterned second mask layer 801-2) over a staircase structure 802 and into substrate 301. Staircase structure 802, a third mask layer 801-3, and a first oxide layer 803 can respectively represent staircase structure 402, third mask layer 701-3, and first oxide layer 501 after the formation of first holes 804. A pattern of first holes 804 can correspond to the first pattern along the x-y plane (e.g., perpendicular along the z axis). In some embodiments, each array-forming region 405 includes 11 columns of first holes 804, extending along the y axis (e.g., perpendicular to the x-z plane). In some embodiments, first holes 804 have substantially a same width D (or diameter) along the x axis. Any suitable etchants can be used to etch through a remaining patterned second mask layer 801-2, third mask layer 801-3, first oxide layer 803, and staircase structure 802.

Figure 9:
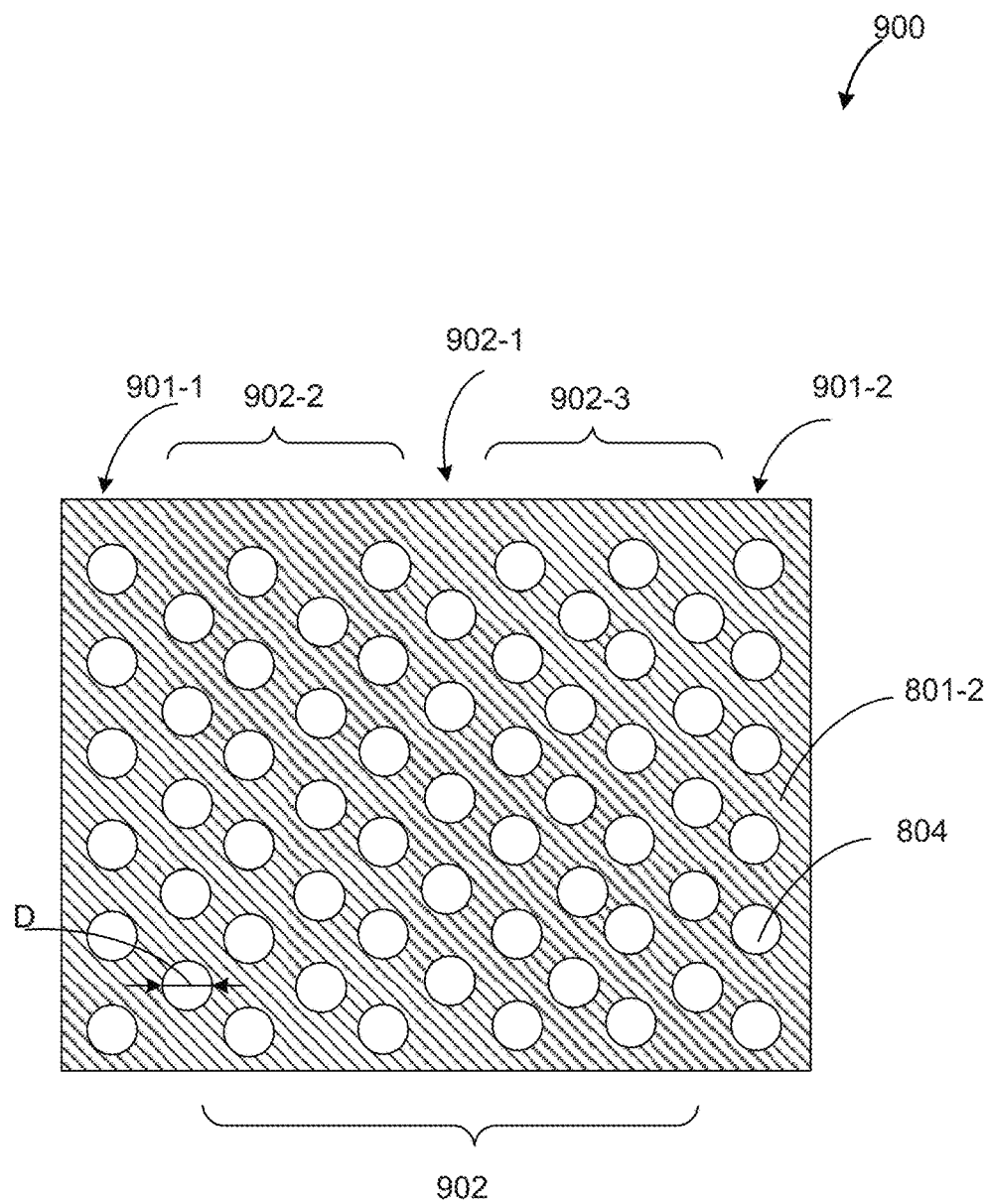
FIG. 9 illustrates a top view of FIG. 8.

FIG. 9 illustrates a top view 900 of array-forming region 450 of FIG. 8 along the x-y plane (e.g., perpendicular to the z axis). As shown in FIG. 9, array-forming region 450 includes 11 columns of first holes 804 each extending from a top surface of remaining patterned second mask layer 801-2. The cross-sections of first holes 804 can be arranged in an array in the x-y plane. The 9 columns of first holes 804 in a center of the array (e.g., an element 902) can be used to form channel holes in subsequent operations. Two columns e.g., elements 901-1 and 901-2) of first holes 804 located adjacent to the boundaries of array-forming region 450 can be used to form GLSs in subsequent operations. Locations of columns 901-1 and 901-2 can correspond to locations of the subsequently-formed GLSs on the x-y plane. For illustrative purposes, two columns 901-1 and 901-2 are referred to as sacrificial/auxiliary columns, and columns between columns 901-1 and 901-2 (e.g., four columns 902-2 and 902-3) are referred to as channel-forming columns 902. Accordingly, first holes 804 of columns 901-1 and 901-2 are referred to as sacrificial/auxiliary holes, and first holes 804 of columns between columns 901-1 and 901-2 (e.g., 902) are referred to as channel-forming hole. In some embodiments, a column 902-1 is located substantially along a middle line (e.g., along the x-y plane) of array-forming region 450. A perpendicular projection of column 902-1 can substantially overlap with the middle line of the underlying trench (or TSG-oxide-fill) on substrate 301, according to some embodiments. Four columns 902-2 and 902-3 can each be located between one of the sacrificial/auxiliary columns (e.g., 901-1 and 901-2) and column 902-1. Locations of four columns 902-2 and 902-3 can each correspond to the location of a subsequently-formed TSG. In some embodiments, first holes 804 of sacrificial/auxiliary columns 901 and channel-forming columns 902 have substantially a same diameter/width D along the x-y plane, as shown in FIG. 9. In some embodiments, D is about 100 nm.

In some embodiments, because channel-forming holes 804 (e.g., first holes of columns 902-1, 902-2, and 901) are positioned between sacrificial/auxiliary holes 804 (e.g., first holes of columns 901-1 and 901-2), the etching condition of each channel-forming hole 804 can be sufficiently similar, and the etching process is more uniform amongst channel-forming holes 804. Accordingly, the dimensions (e.g., width or diameter in the x-y plane) of channel-forming holes 804 can have improved uniformity. Also, semiconductor channels formed based on channel-forming holes 804 can have improved dimensional uniformity. Because sacrificial/auxiliary holes 804 and the subsequent dielectric filling structures formed in sacrificial/auxiliary holes 804 can function as place-holders that are to be removed for the formation of GLSs, the etching quality of sacrificial/auxiliary holes 804 has little or no effect on the uniformity of subsequent semiconductor channels. Thus, channel-forming holes 804 with improved dimensional uniformity can be formed, and semiconductor channels formed from channel-forming holes 804 can have improved dimensional uniformity and electrical performances.

Figure 10:
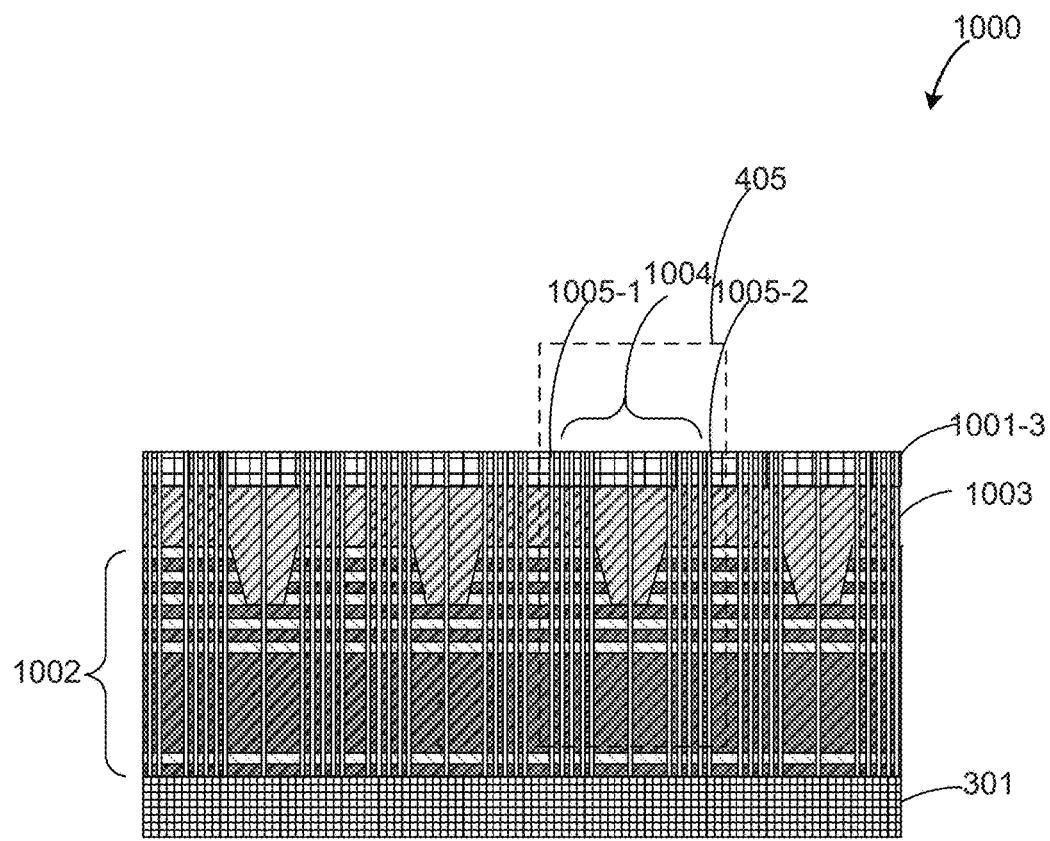

Further, the remaining patterned second mask layer can be removed to form second holes, and channel-forming layers/films can be formed to fill in the second holes. FIG. 10 illustrates a corresponding memory structure 1000. As shown in FIG. 10, memory structure 1000 can include a plurality of channel-forming structures 1004 and sacrificial/auxiliary structures 1005, each extending from the top surface of a third mask layer 1001-3 to substrate 301. Elements 1005-1 and 1005-2 can each represent a cross-section of sacrificial/auxiliary structure 1005 of a sacrificial/auxiliary column, arranged on the boundaries of array-forming region 405. Element 1004 represents channel-forming structures distributed between sacrificial/auxiliary structures 1005-1 and 1005-2. Channel-forming structures 1004 can by formed by channel-forming holes filled with channel-forming layers/films, and sacrificial/auxiliary structures 1005 can be formed by sacrificial/auxiliary holes filled with channel-forming layers/films. A charge trapping film, a semiconductor channel film, and a dielectric core can be arranged sequentially from the sidewall to the center of channel-forming structure 1004 or sacrificial/auxiliary structure 1005. In some embodiments, the top surface of memory structure 1000 is planarized to expose channel-forming structures 1004 and third mask layer 1001-3. A staircase structure 1002, a first oxide layer 1003, and third mask layer 1001-3 respectively represent staircase structure 802, first oxide layer 803, and third mask layer 801-3, after the formation of channel-forming structures.

Memory structure 1000 can be formed by any suitable processes. In some embodiments, remaining patterned second mask layer 801-2 is removed by a suitable process, e.g., an aching process. Second holes can then be formed from first holes 804 after the removal of remaining patterned second mask layer 801-2. Third mask layer 801-3 can be exposed. Further, a suitable cleaning process can be performed to remove photoresist residuals (e.g., from a patterned first photoresist layer 602) and/or any contaminating substance (e.g., by-products of the etching process such as polymers) in the second holes. In some embodiments, the cleaning process includes a strip process and/or a wet etch.

Further, a series of channel-forming films/layers (not shown) can be sequentially deposited into the second holes in array-forming region 405 to form channel-forming structures 1004 and sacrificial/auxiliary structures 1005. In some embodiments, a charge trapping film is deposited over the sidewall of a second hole. The charge trapping film can include one or more block dielectric layers over the side wall of the second hole to insulate other layers in the second hole from staircase structure 1002. The charge trapping film can also include a storage unit layer (memory layer) over and surrounded by the block dielectric layers for trapping charges and forming a plurality of charge storage regions along the z axis. The charge trapping film can also include a tunneling layer (e.g., tunneling dielectric) over and surrounded by the memory layer. Charge tunneling can be performed through the tunneling layer under a suitable electric bias.

The one or more block dielectric layers can include a first block layer which includes a dielectric metal oxide layer with a relatively high dielectric constant. The term "metal oxide" can include a metallic element and non-metallic elements such as oxygen, nitrogen, and other suitable elements. For example, the dielectric metal oxide layer can include aluminum oxide, hafnium oxide, lanthanum oxide, yttrium oxide, tantalum oxide, silicates, nitrogen-doped compounds, alloys, etc. The first block layer can be deposited, for example, by CVD, ALD, pulsed laser deposition (PLD), liquid source misted chemical deposition, and/or other suitable deposition methods.

The one or more block dielectric layers can also include a second block layer which includes another dielectric layer over the dielectric metal oxide. The other dielectric layer can be different from the dielectric metal oxide layer. The other dielectric layer can include silicon oxide, a dielectric metal oxide having a different composition than the first block layer, silicon oxynitride, silicon nitride, and/or other suitable dielectric materials. The second block layer can be deposited, for example, by low pressure chemical vapor deposition (LPCVD), ALD, CVD, and/or other suitable deposition methods. In some embodiments, the one or more block dielectric layers include silicon oxide, which is formed by CVD.

Then a storage unit layer can be formed over the one or more block dielectric layers. The storage unit layer can include a charge trapping material, e.g., a dielectric charge trapping material (e.g., silicon nitride) and/or a conductive material (e.g., doped polysilicon). In some embodiments, the dielectric charge trapping material includes silicon nitride and can be formed by CVD, ALD, PVD, and/or other suitable deposition methods.

Then a tunneling layer can be formed over the memory layer. The tunneling layer can include silicon oxide, silicon nitride, silicon oxynitride, dielectric metal oxides, dielectric metal oxynitride, dielectric metal silicates, alloys, and/or other suitable materials. The tunneling layer can be formed by CVD, ALD, PVD, and/or other suitable deposition methods. In some embodiments, the tunneling layer includes silicon oxide, which is formed by CVD.

Further, a semiconductor channel film can be formed over charge trapping layers in the second holes. Semiconductor channel film can include one or more layers of any suitable semiconductor materials such as silicon, silicon germanium, germanium, III-V compound material, II-VI compound material, organic semiconductor material, and/or other suitable semiconductor materials. Semiconductor channel film can be formed by a suitable deposition method such as metal-organic chemical vapor deposition (MOCVD), LPCVD, CVD, and/or other suitable deposition methods. In some embodiments, semiconductor channel film is formed by depositing a layer of amorphous silicon using CVD, followed by an annealing process such that the amorphous silicon is converted to single-crystalline silicon. In some embodiments, other amorphous material can be annealed to be crystallized to form semiconductor channel film.

Further, a dielectric core can be formed by depositing a suitable dielectric material over semiconductor channel films in the second holes. Dielectric core can fill in the space at the center of a second hole. Dielectric core can include a suitable dielectric material such as silicon oxide and/or organosilicate glass. The dielectric core can be formed by a suitable conformal deposition method (e.g., LPCVD) and/or self-planarizing deposition method (e.g., spin coating). In some embodiments, dielectric core includes silicon oxide and is formed by LPCVD. In some embodiments, a suitable planarization process (e.g., CMP and/or recess etch) is performed to remove any excessive materials (e.g., channel-forming layers/films) over the top of memory structure 1000.

Figure 11:
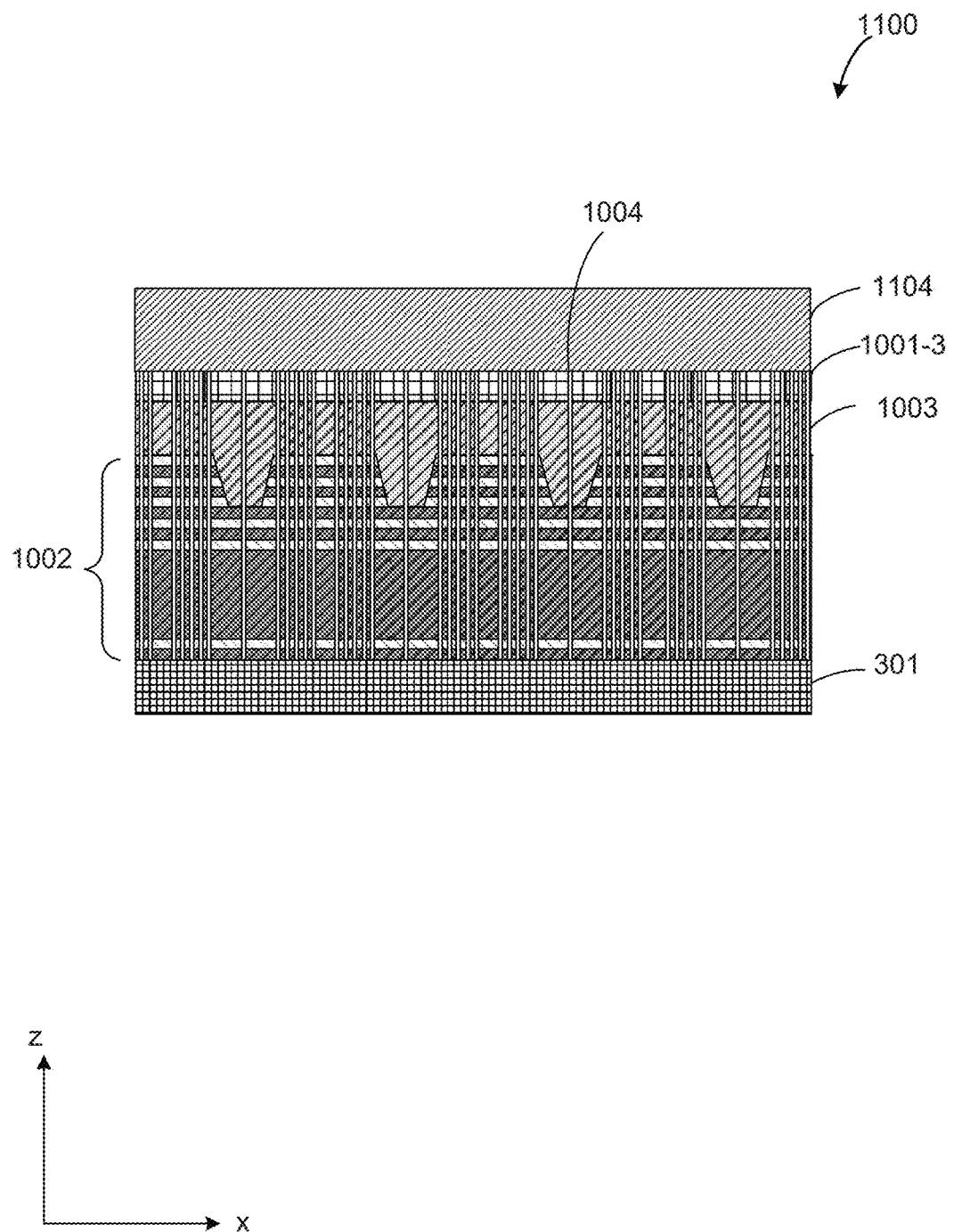

After the channel-forming structures are formed, a photoresist layer can be formed over the third mask layer. FIG. 11 illustrates a corresponding memory structure 1100. As shown in FIG. 11, a photoresist layer 1104 can be formed to coat third mask layer 1101-3. Further, the photoresist layer can be patterned to form a patterned photoresist layer and used as an etch mask to remove the sacrificial/auxiliary structures and form dielectric filling holes.

Figure 12:
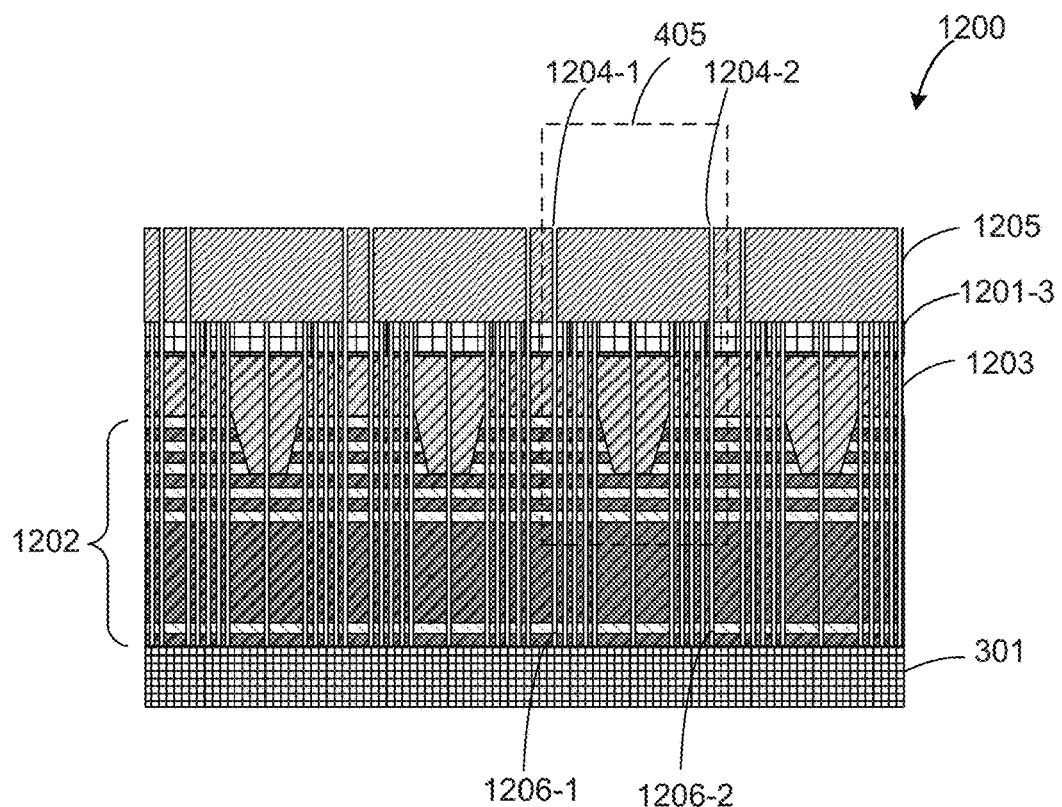

FIG. 12 illustrates a corresponding memory structure 1200. Photoresist layer 1104 can be patterned to form a second patterned photoresist layer 1205, as shown in FIG. 12. Second patterned photoresist layer 1205 can include a second pattern. In some embodiments, second patterned photoresist layer 1205 includes two columns (e.g., columns 1204-1 and 1204-2) of openings in an array-forming region 405, extending along the y axis (e.g., perpendicular to the x-z plane) and exposing the underlying portions of third mask layer 1101-3. The openings of columns 1204-1 and 1204-2 can each align with the respective underlying sacrificial/auxiliary structures of the sacrificial/auxiliary column. In some embodiments, the width/diameter (e.g., along the x axis or the x-y plane) of each opening of columns 1204-1 and 1204-2 is the same as or greater than the width/diameter respective underlying sacrificial/auxiliary structures to ensure the underlying sacrificial/auxiliary structures can be fully removed in subsequent operations.

Further, second patterned photoresist layer 1205 can be used as an etch mask to remove the two sacrificial/auxiliary structures. Accordingly, dielectric filling holes 1206-1 and 1206-2 can be formed in the two sacrificial/auxiliary columns. Each of dielectric filling holes 1206-1 and 1206-2 can extend from the top surface of a third mask layer 1201-3 to substrate 301, and the cross-sections of dielectric filling holes 1206-1 and 1206-2 can extend along the y axis. In some embodiments, a dry etching process (e.g., RIE) is performed to completely remove the channel-forming layers/films in the sacrificial/auxiliary structures. Optionally, a suitable cleaning process can be performed to remove photoresist residuals (e.g., from second patterned photoresist layer 1205) and/or any contaminating substance (e.g., by-products of etching process such as polymers) in dielectric filling holes 1206-1 and 1206-2. In some embodiments, the cleaning process includes a strip process and/or a wet etch. A staircase structure 1202, a first oxide layer 1203, and third mask layer 1201-3 respectively represent staircase structure 1102, first oxide layer 1103, and third mask layer 1101-3 after the formation of dielectric filling holes 1206-1 and 1206-2.

Figure 13:
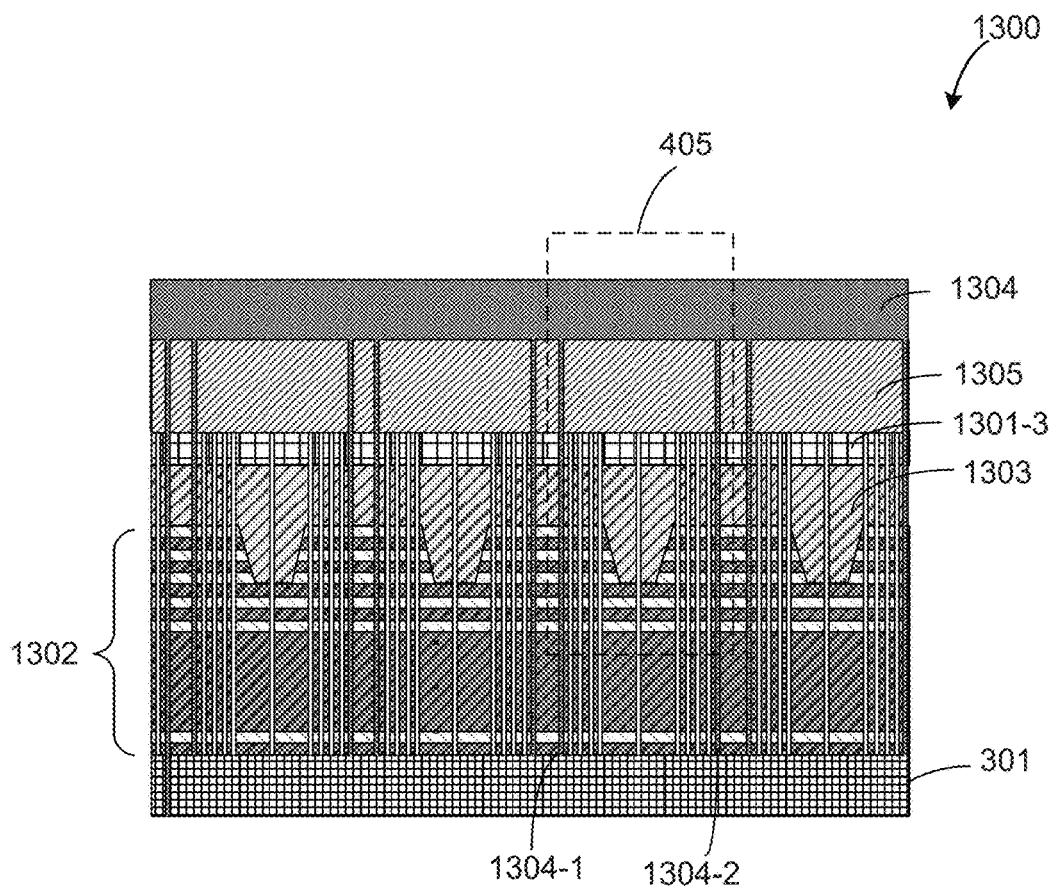

After the formation of dielectric filling holes, a dielectric filling material can be filled into the dielectric filling holes to form sacrificial structures. FIG. 13 illustrates a corresponding memory structure 1300. As shown in FIG. 13, a dielectric filling material can be filled into sacrificial/auxiliary holes (e.g., 1206-1 and 1206-2 of FIG. 12) to form dielectric filling structures (e.g., elements 1304-1 and 1304-2) and can form a dielectric filling layer 1304 over a second patterned photoresist layer 1305. Dielectric filling structures 1304-1 and 1304-2 can extend from a bottom of dielectric filling layer 1304 into substrate 301. In some embodiments, the dielectric filling material includes at least one dielectric material that forms a staircase structure 1302. In some embodiments, the dielectric filling material includes silicon oxide.

The dielectric filling material can be deposited using any suitable methods. In some embodiments, a low temperature spin-on method is used to deposit low temperature spin-on dielectric (SOD) over second patterned photoresist layer 1305 and into dielectric filling holes. Further, a curing process, e.g., a ultraviolet (UV) bake process and/or a thermal treatment, can be performed on dielectric filling layer 1304 and dielectric filling structures 1304-1 and 1304-2 to, e.g., improve film/layer quality. In some embodiments, a width/diameter of each dielectric filling structure (e.g., 1304-1 and 1304-2) can be about D (e.g., being at least substantially the same as the width/diameter of first holes 804). Staircase structure 1302, a first oxide layer 1303, a third mask layer 1301-3, and second patterned photoresist layer 1305 respectively represent staircase structure 1202, first oxide layer 1203, third mask layer 1301-3, and second patterned photoresist layer 1205 after the formation of dielectric filling structures 1304-1 and 1304-2 and dielectric filling layer 1304.

Further, dielectric filling layer 1304 and second patterned photoresist layer 1305 can be removed, e.g., using any suitable processes. In some embodiments, a dry etching process is performed to remove dielectric filling layer 1304 and/or second patterned photoresist layer 1305. In some embodiments, a strip and/or a wet etch process are used to remove second patterned photoresist layer 1305. Third mask layer 1301-3 can be exposed.

Figure 14:
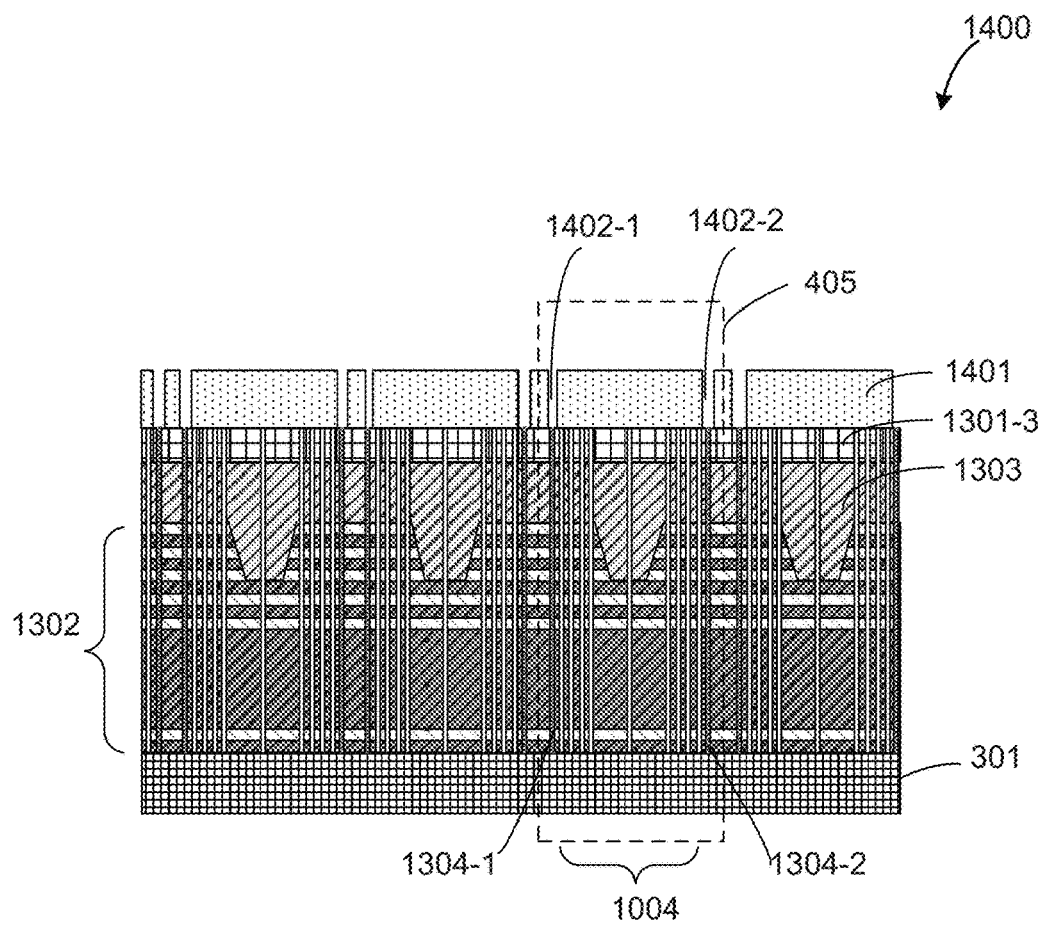
Figure 14:
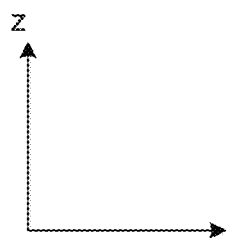

After the dielectric filling layer and the second patterned photoresist layer are removed, a third patterned photoresist layer can be formed over the third mask layer. FIG. 14 illustrates a corresponding memory structure 1400.

As shown in FIG. 14, a third patterned photoresist layer 1401 having a third pattern can be formed over third mask layer 1301-3. The third pattern can include two trenches 1402-1 and 1402-2 extending along the y axis (e.g., perpendicular to the x-z plane) in an array-forming region 405. Trenches 1402-1 and 1402-2 can at least substantially align with the underlying dielectric filling structures 1304-1 and 1304-2 (e.g., of the two columns adjacent to the boundaries of array-forming region 405) along the z axis and can each expose a portion of third mask layer 1301-3 over the underlying dielectric filling structures 1304-1 and 1304-2. The exposed portions of third mask layer 1301-3 can extend along they axis (e.g., having a strip shape). In some embodiments, a width D2 (e.g., along the x axis) of each of trenches 1401-1 and 1401-2 is at least equal to the width/diameter D of a dielectric filling structures 1304-1 and 1304-2. In some embodiments, D2 is greater than D. In some embodiments, the projections of trenches 1402-1 and 1402-2 can each cover the projections of sacrificial/auxiliary holes of the respective dielectric filling structure. Third patterned photoresist layer 1401 can be formed by any suitable processes. In some embodiments, third patterned photoresist layer 1401 is formed by patterning a photoresist layer to form trenches (e.g., 1401-1 and 1401-2.)

Figure 15:
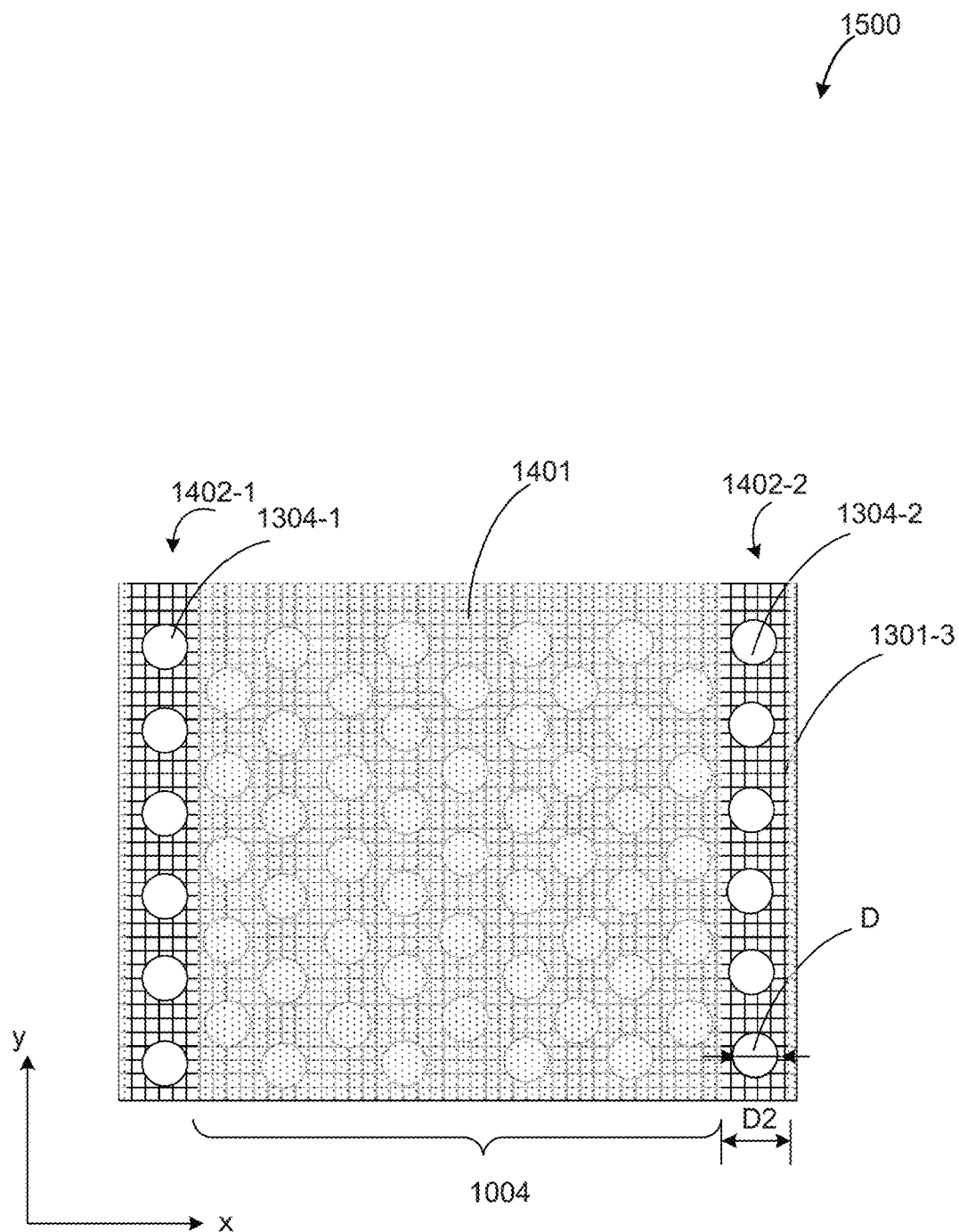
FIG. 15 illustrates a top view of FIG. 14.

FIG. 15 illustrates a top view 1500 of array-forming region 405. As shown in FIG. 15, a third patterned photoresist layer 1401 can cover the channel-forming structures 1004 and expose (e.g., by trenches 1401-1 and 1401-2) the two columns of dielectric filling structures 1304-1 and 1304-2 and portions of third mask layer 1301-3. The exposed portions of third mask layer 1301-3 can have strip shapes extending along the y axis.

Third patterned photoresist layer 1401 can be formed by any suitable process. In some embodiments, third patterned photoresist layer 1401 is formed by forming a third photoresist layer over third mask layer 1301-3 and patterning (e.g., using photolithography) the third photoresist layer to form trenches 1402-1 and 1402-2 in array-forming region 405.

Figure 16:
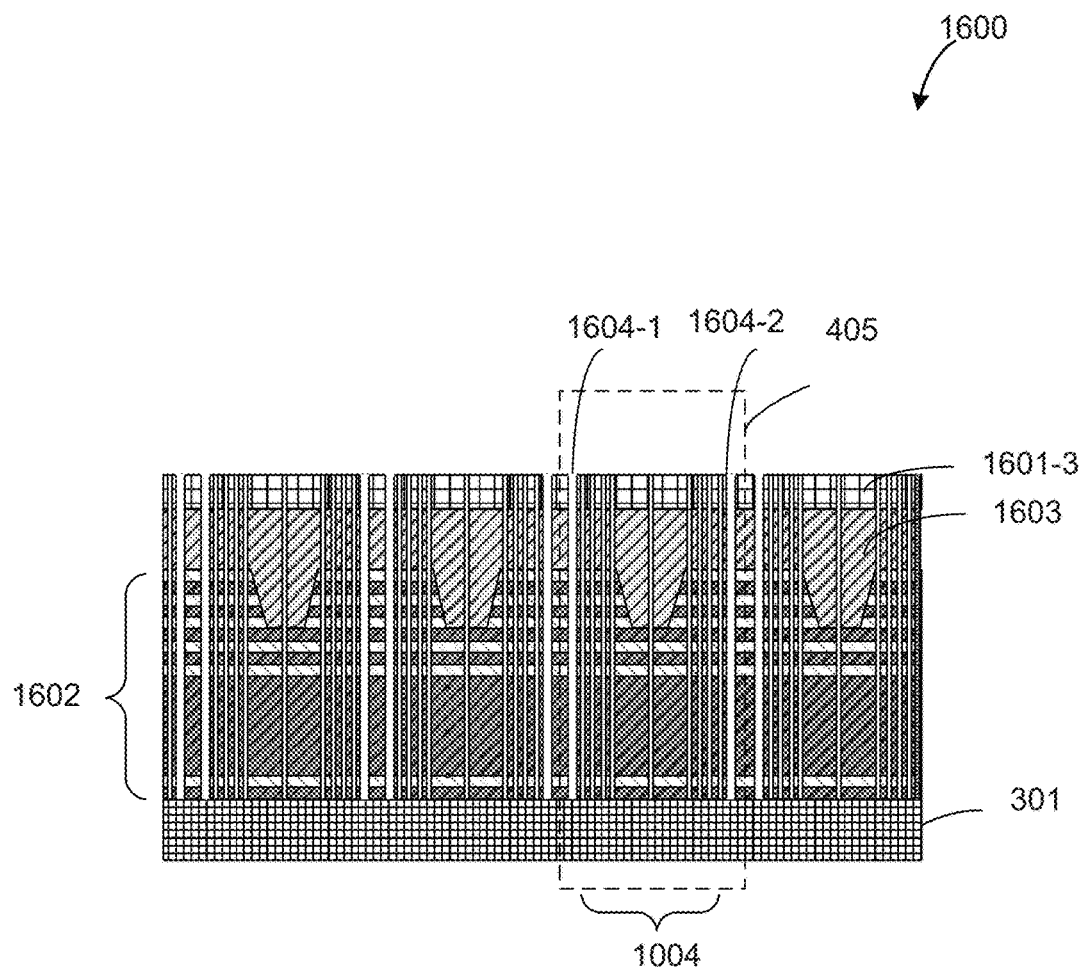

Further, the third patterned photoresist layer can be used as an etch mask to form GLS-forming trenches. The third patterned photoresist layer can then be removed. FIG. 16 illustrates a corresponding memory structure 1600. A suitable etching process (e.g., dry etch and/or wet etch) can be performed to etch away the two columns of dielectric filling structures 1304-1 and 1304-2 and portions of the staircase structure exposed by third patterned photoresist layer 1401 to form GLS-forming trenches (e.g., elements 1604-1 and 1604-2.) Width D2' of a GLS-forming trench (e.g., elements 1601-1 or 1604-2) can be substantially greater than width/diameter D of a channel-forming structure 1004. D2' can be in a range of about 120-180 nm and D can be about 100 nm. In some embodiments, D2' is about 150 nm. At least one GLS-forming trench can be formed. In some embodiments, array-forming region 405 includes two GLS-forming trenches each extending from a top surface of a third mask layer 1601-3 into substrate 301. Third mask layer 1601-3, first oxide layer 1603, and a staircase structure 1602 respectively represent third mask layer 1301-3, a first oxide layer 1303, and staircase structure 1302 after the formation of GLS-forming trenches (e.g., 1604-1 and 1604-2.)

Figure 17:
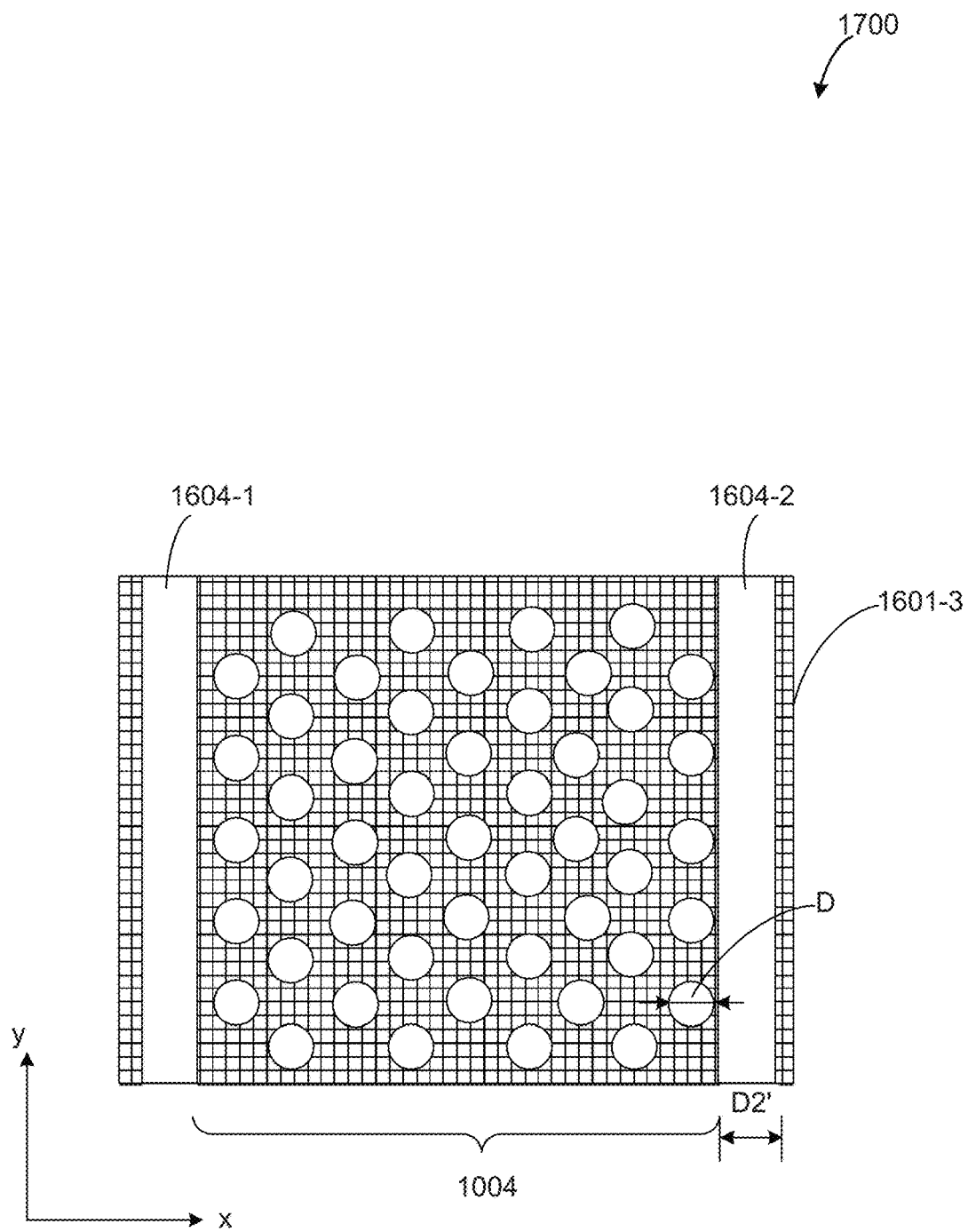
FIG. 17 illustrates a top view of FIG. 16.

FIG. 17 illustrate a top view 1700 of array-forming region 405 of FIG. 16. As shown in FIG. 17, the area (or projection on substrate 301) of each of GLS-forming trenches 1604-1 and 1604-2 can fully cover the area of the respective dielectric filling structures on the x-y plane. In some embodiments, width D2 of a GLS-forming trench (e.g., 1604-1 or 1604-2) is greater than width/diameter D of a channel-forming structure 1004. In some embodiments, the area (or projection on substrate 301) of each of GLS-forming trenches 1604-1 and 1604-2 overlap with the area (or projection on substrate 30 of at least one dielectric filling structures.

GLS-forming trenches 1604-1 and 1604-2 can be formed by any suitable processes. In some embodiments, the etching of staircase structure 1302 includes the removal of exposed materials/parts along a direction perpendicular to substrate 301 (e.g., the z axis). The etch can remove the two columns of dielectric filling structures 1304-1 and 1304-2 together with portions of the staircase structure (e.g., between adjacent dielectric filling structures). In some embodiments, a same etchant is used to simultaneously etch the two columns of dielectric filling structures 1304-1 and 1304-2, and the materials of staircase structure 1302. In some embodiments, an anisotropic etchant (e.g., dry etch and/or wet etch) is used for the etching process. In some embodiments, the formation of GLS-forming trenches 1604-1 and 1604-2 completely removes dielectric filling structures 1304-2 in array-forming region 405.

Further, the third patterned photoresist layer 1401 can be removed, by any suitable rinsing/strip/etching process. In some embodiments, a strip and/or wet etching process is performed to clean GLS-forming trenches 1604-1 and 1604-2 and remove any contaminating substance (e.g., photoresist residues or etch by-product) in GLS-forming trenches 1604-1 and 1604-2.

Figure 18:
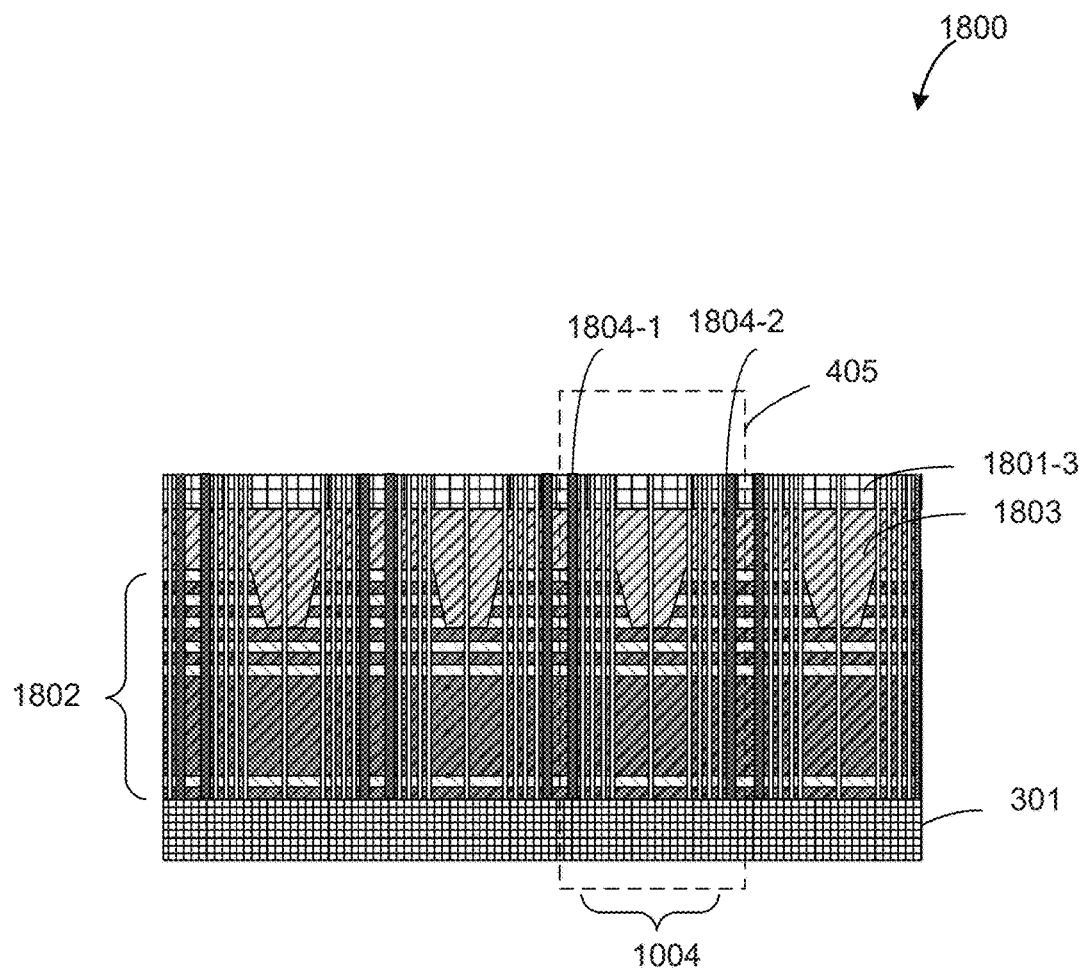

After the formation of GLS-forming trenches, a conductive material can be deposited to fill in the GLS-forming trenches and form GLSs. A planarization process can be performed to remove any excessive materials on the third mask layer. FIG. 18 illustrates a corresponding memory structure 1800. As shown in FIG. 18, GLSs 1804-1 and 1804-2 are formed in array-forming region 405. FIG. 19 illustrates a top view 1900 of memory structure 1800. GLSs 1804-1 and 1804-2 can be filled with any suitable conductive materials such as tungsten, aluminum, and/or copper. In some embodiments, GLSs 1804-1 and 1804-2 are filled with tungsten. A staircase structure 1802, a third mask layer 1801-3, and a first oxide layer 1803 represents staircase structure 1602, third mask layer 1601-3, and a first oxide layer 1603 after the formation of GLS.

The conductive material can be deposited by any suitable processes such as CVD, sputtering, and/or PVD. In some embodiments, a CVD process is performed to deposit tungsten. Optionally, a planarization process (e.g., CMP and/or recess etch) can be performed to remove any excessive materials (e.g., conductive materials) over third mask layer 1801-3.

In some embodiments, the third mask layer 1801-3 is removed after the planarization process. Accordingly, the remaining portions of channel-forming structures 1004 (e.g., extending from the top surface of first oxide layer 1803 into substrate 301) can form semiconductor channels. In some embodiments, drain regions can be formed in the top portion of each semiconductor channel. The drain regions can be surrounded by third mask layer 1801-3.

In subsequent fabrication operations, word lines can be formed by removing the sacrificial layers in the staircase structure (e.g., staircase structure 1802) and filling the space formed by the removal of sacrificial layers with a suitable conductive metal (e.g., tungsten). However, the specific order to form the word lines and the channel holes should be subjected to different applications and/or designs and should not be limited by the embodiments of the present disclosure.

In some embodiments, the channel-forming holes and the first sacrificial/auxiliary holes are formed separately for the subsequently-formed GLS-forming trenches. For example, the channel-forming holes can be formed (e.g., by a patterning/etching process) and filled with the channel-forming layers/films before the formation of the sacrificial/auxiliary holes (e.g., by another patterning/etching process). In another example, the sacrificial/auxiliary holes can be formed and filled with a dielectric filling material before the formation of the channel-forming holes. In some embodiments, the dielectric filling material includes at least one of the dielectric materials that form the staircase structure. Thus, the dielectric filling material can be etched away with portions of the staircase structure at the same time (e.g., using the same etchant) when forming the GLS-forming trenches.

In some embodiments, a method for forming a 3D memory for improving uniformity of a channel hole includes providing a body structure that includes a substrate and a staircase structure formed on the substrate, and forming a TSG on the staircase structure, forming channel holes in the staircase structure. Each TSG corresponds to predetermined channel holes, and the outermost two columns of channel holes away from the TSG are sacrificial holes. The method also includes sequentially filling the sacrificial holes with an oxide material, etching the oxide material, and filling the etched portion with a metal, GLS can be formed.

In some embodiments, the staircase structure includes a plurality of alternatingly arranged oxide layers and nitride layers, the nitride layer being formed between adjacent oxide layers.

In some embodiments, a process of forming a TSG over the staircase structure includes etching the staircase structure to form a trench and filling the trench with oxide. The process can further include forming a first oxide layer overlying the top surface of the staircase structure.

In some embodiments, the channel hole holes are formed on the staircase structure with the TSG, so that each of the TSG corresponds to predetermined channel hole holes. This process includes forming a hard mask layer on the first oxide layer. The hard mask layer can include a first hard mask layer, a second hard mask layer, and a third hard mask layer from top to bottom. The process also includes forming a first photoresist layer on the first hard mask layer and patterning the first photoresist layer to expose a top surface of the first hard mask layer. Patterning the first photoresist layer can form a first pattern so that the TSG corresponds to the 11 columns of the first pattern. The process further includes etching the first hard mask layer and the second hard mask layer to form an opening corresponding to the first pattern. The process can further include removing the first photoresist layer. The process can further include using the first hard mask layer containing the opening and the second hard mask layer containing the opening as an etch mask to form a channel hole, and removing the first hard mask layer and a part of the second hard mask layer. The process can further include removing the remaining second hard mask layer and cleaning the polymer in the channel hole.

In some embodiments, the first photoresist layer is removed by a wet etching process and the first hard mask layer containing the opening is removed by a dry etching process. In some embodiments, a portion of the second hard mask layer is removed by an aching process, and the polymer in the channel hole is removed by a wet etching process.

In some embodiments, the step of performing an oxide filling, etching, and metal filling process on the sacrificial holes to form a GLS includes sequentially filling the sacrificial holes with a silicon dioxide, etching the filled silicon dioxide, and filling in tungsten.

In some embodiments, the step of performing an oxide filling, etching, and metal filling process on the sacrificial holes to form a GLS includes forming a second photoresist layer over the third hard mask layer, patterning the second photoresist layer to form a second pattern corresponding to the auxiliary hole, and forming a second pattern having the same width as the auxiliary hole. The process can also include oxidizing the through hole through the spin coating method at a low temperature, and forming a second oxide layer covering the upper surface of the second photoresist layer. The process can further include performing an ultraviolet light baking. The process can further include removing the second oxide layer and the second photoresist layer, forming a third photoresist layer, and patterning the third photoresist layer to expose a top surface of the filled sacrificial hole. The process can further include forming the third pattern having a width larger than a width of the filled sacrificial hole. The process can further include using the third photoresist layer with the third pattern as an etch mask to form a GLS trench, and removing the third photoresist layer, and filling the GLS trench to form a GLS.

In some embodiments, the second oxide layer is removed by a dry etching process. In some embodiments, the second photoresist layer and the third photoresist layer are removed by wet etching processes.

In some embodiments, the method further includes performing a planarization process after filling the gate line trenches.

Embodiments of the present disclosure provide a method and structure for improving the channel hole uniformity in 3D memory device fabrication. The disclosed method and structure employs sacrificial structures to improve the dimensional uniformity of the channel holes. The sacrificial structures can facilitate more uniform etching condition that forms the channel hole so that the channel holes formed by this method can have more uniform dimensions. To form channel holes with improved dimensional uniformity, sacrificial/auxiliary holes can be formed on the boundaries of the array-forming region. These sacrificial/auxiliary holes can be formed with the surrounded/sandwiched channel-forming holes by the same patterning/etching processes (e.g., same photomask and photolithography process). The sacrificial/auxiliary holes can have the same dimensions as the channel-forming holes. Because the sacrificial/auxiliary holes improve the pattern uniformity of the channel-forming holes, the etching condition of the channel-forming holes can be sufficiently similar, and the etching of the channel-forming holes can have improved uniformity. The channel-forming holes can have improved dimensional uniformity.

Further, the channel-forming holes and the sacrificial/auxiliary holes are filled with channel-forming layers/films to form channel-forming structures and sacrificial/auxiliary structures by same fabrication processes (e.g., depositions). The sacrificial/auxiliary structures can then be replaced with dielectric filling structures (e.g., by etching of the sacrificial/auxiliary structures and deposition of a dielectric material) to, e.g., facilitate complete removal of the channel-forming layers/films of the sacrificial/auxiliary structures. GLS-forming trenches can further be formed by fully removing the dielectric filling structures. GLSs can further be formed by depositing a conductive material into the GLS-forming trenches.

Embodiments of the present disclosure also provide a method to compensate etching uniformities. The method includes a loop process to compensate for etching uniformities. For example, first, etching conditions of a first batch of channel holes can be determined. Based on the etching results (e.g., the dimensions of the channel holes), a desired number and/or arrangement of sacrificial/auxiliary structures (e.g., sacrificial/auxiliary holes) can be determined and formed in the fabrication of the second batch of channel holes. The etching results of the second batch can be measured and used as feedback to further adjust the dimensions, arrangement, and/or number of the channel holes until the channel holes are formed with sufficient uniformity.

By using the disclosed method and structure, pattern uniformity of the channel-forming holes can be improved during the etching process of the channel-forming holes. The sacrificial/auxiliary holes can be formed by the same patterning/etching process and can function as place holders for the subsequent formation of GLSs. The semiconductor channels formed based on the channel-forming holes can have improved dimensional uniformity, and the corresponding 3D memory device can have improved electrical performance.

It should be noted that, the formation of the channel hole arrangement (e.g., 9-hole array channel hole arrangement) of the present disclosure is for illustrative purposes only, and the number (or column number) of sacrificial/auxiliary holes should also be determined based on different applications/designs. For example, the sacrificial/auxiliary holes can also be arranged in different locations of the channel hole array to compensate etching uniformities of these locations. In various embodiments, the dimensions, the arrangement, and the number (or column number) of sacrificial/auxiliary holes are determined based on the different arrangement and/or etching conditions of semiconductor channels and should not be limited by the embodiments of the present disclosure.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional memory device, comprising:
    disposing a material layer over a substrate;
    forming two adjacent top select gates (TSGs) separated by a TSG-oxide-fill in an array-forming region of the material layer;
    after forming the TSG-oxide-fill, forming a plurality of channel-forming holes and a plurality of sacrificial holes in the array-forming region of the material layer, wherein the plurality of sacrificial holes include a first column and a second column of sacrificial holes each located on a different side of the TSG-oxide-fill; and
    forming a plurality of semiconductor channels based on the channel-forming holes and at least one gate line slit (GLS) based on at least one of the plurality of sacrificial holes, wherein the at least one GLS includes a wall structure penetrating the material layer and contacting with the substrate, and a location of the at least one GLS overlaps with the at least one of the plurality of sacrificial holes.

2. The method of claim 1, wherein forming the plurality of channel-forming holes and the plurality of sacrificial holes comprises:
    forming a first patterned photoresist layer over the material layer, wherein the first patterned photoresist layer comprises a plurality of channel-forming openings and a plurality of sacrificial openings; and
    forming the plurality of channel-forming openings and the plurality of sacrificial openings through the material layer until the substrate is exposed.

3. The method of claim 1, further comprising locating the plurality of sacrificial holes adjacent to boundaries of the array-forming region.

4. The method of claim 3, further comprising forming the plurality of channel-forming; holes and the plurality of sacrificial holes to have the same cross-sectional dimensions.

5. The method of claim 4, further comprising:
arranging the plurality of channel-forming, holes and the plurality of sacrificial holes in an array; and
locating the plurality of channel-forming holes adjacent to the plurality of sacrificial holes.

6. The method of claim 5, further comprising:
forming the plurality of channel-forming holes and the plurality of sacrificial holes in the array-forming region;
locating the first column and the second column of sacrificial holes that is distributed adjacent to the boundaries of the array-forming region.

7. The method of claim 6, further comprising:
arranging the first column and the second column of sacrificial holes to be adjacent to a boundary of the array.

8. The method of claim 7, further comprising forming the plurality of sacrificial holes of the same dimensions as the plurality of channel-forming holes.

9. The method of claim 8, wherein forming the plurality of semiconductor channels based on the channel-forming holes and the at least one GLS based on the at least one of the plurality of sacrificial holes comprises:
filling the plurality of channel-forming holes with channel-forming layers;
forming a plurality of dielectric filling structures based on the plurality of sacrificial holes;
forming at least one GLS-forming trench to remove the plurality of dielectric filling structures; and
filling the at least one GLS-forming trench with a conductive material.

10. The method of claim 9, wherein forming the plurality of dielectric filling structures based on the plurality of sacrificial holes comprises:
filling the plurality of sacrificial holes with the channel-forming layers;
removing the channel-forming layers in the plurality of sacrificial holes to form a plurality of dielectric filling holes; and
forming a dielectric filling material in the plurality of dielectric filling holes.

11. The method of claim 10, wherein forming the dielectric filling material comprises performing a low-temperature spin-on dielectric process.

12. The method of claim 11, further comprising forming the at least one GLS-forming trench with a projection portion on the substrate that covers a projection of at least one of the plurality of dielectric filling structures on the substrate.

13. The method of claim 12, further comprising forming two GLS-forming trenches each being located adjacent to a different side of the boundaries of the array-forming region.

14. The method of claim 12, further comprising forming the at least one GLS-forming trench with a projection portion on the substrate that is greater than the projection of the plurality of dielectric filling structures on the substrate.

15. The method of claim 14, further comprising forming the dielectric filling material with at least one material that forms the material layer.

16. The method of claim 15, wherein forming the dielectric filling material comprises forming silicon oxide.

17. The method of claim 16, further comprising forming the plurality of dielectric tilling holes of dimensions the same as the plurality of sacrificial holes.

18. The method of claim 17 further comprising:
cleaning the plurality of channel-forming holes before filling the plurality of channel-forming holes with the channel-forming layers; and
planarizing the at least one GLS-forming trench after the conductive material is filled therein.

19. The method of claim 1, wherein the material layer includes at least one of a staircase structure and a dielectric stack.

20. The method of claim 1, wherein forming the plurality of sacrificial holes further comprises forming a third row of sacrificial holes each penetrating the TSG-oxide-fill.

* * * * *

UNITED STATES PATENT AND TRADEMARK OFFICE
CERTIFICATE OF CORRECTION

PATENT NO. : 11,329,061 B2
APPLICATION NO. : 16/126267
DATED : May 10, 2022
INVENTOR(S) : Xiao et al.

It is certified that error appears in the above-identified patent and that said Letters Patent is hereby corrected as shown below:

On the Title Page

Column 1, Item (30), in "Foreign Application Priority Data", delete "Aug. 2, 2018 (CN) ................... 201710775876.7" and insert --Aug. 31, 2017 (CN) .................... 201710775876.7--.

Signed and Sealed this
Second Day of August, 2022

Katherine Kelly Vidal
*Director of the United States Patent and Trademark Office*